United States Patent
Kuroda

[19]

[11] Patent Number: 5,929,693
[45] Date of Patent: Jul. 27, 1999

[54] SUBSTRATE BIAS GENERATOR FOR SEMICONDUCTOR INTEGRATED CIRCUIT DEVICE

[75] Inventor: Tadahiro Kuroda, Yokohama, Japan

[73] Assignee: Kabushiki Kaisha Toshiba, Tokyo, Japan

[21] Appl. No.: 08/790,338

[22] Filed: Jan. 28, 1997

[30] Foreign Application Priority Data

Feb. 5, 1996 [JP] Japan ...................................... 8-019104

[51] Int. Cl.$^6$ ........................................................ G05F 1/10
[52] U.S. Cl. ........................................... 327/535; 327/537
[58] Field of Search ................................... 327/534, 535, 327/537

[56] References Cited

U.S. PATENT DOCUMENTS

| | | | |
|---|---|---|---|
| 4,769,784 | 9/1988 | Doluca et al. | 365/149 |
| 5,546,044 | 8/1996 | Calligaro et al. | 327/543 |
| 5,642,072 | 6/1997 | Miyamoto et al. | 327/535 |

FOREIGN PATENT DOCUMENTS

| | | |
|---|---|---|
| 0271686 | 6/1988 | European Pat. Off. . |
| 8273357 | 10/1996 | Japan . |

OTHER PUBLICATIONS

Yoo, et al. "Variable $V_{cc}$ Design Techniques for Battery–Operated DRAMs." IEICE Transactions on Electronics E76–C (1993) May, No. 5, Tokyo; pp. 839–843.

*Primary Examiner*—Terry D. Cunningham
*Attorney, Agent, or Firm*—Loeb & Loeb LLP

[57] ABSTRACT

The semiconductor integrated circuit device can control the threshold voltage of MOSFETs at a low value while keeping the variation thereof at a small level in operation mode, but switches the threshold voltage thereof from the low value to a high value in standby mode. The semiconductor integrated circuit device comprises: a detecting circuit for detecting a physical quantity (e.g., substrate bias) of a semiconductor substrate and for outputting n-units (n≧2) of first to n-th output signals decided according to a region to which the detected physical quantity belongs, the region being decided separately on the basis of n-units of the first to n-th set values; a control circuit for outputting drive signals on the bias of a control signal and the first to n-th output signals of the detecting circuit; a substrate potential generating circuit activated on the basis of one of the drive signals of the control circuit, to allow the substrate bias to be deep by pumping out charges from the semiconductor substrate; and a substrate charge injecting circuit activated on the basis of the other of the drive signals of the control circuit, to allow the substrate bias to be shallow by injecting charges to the semiconductor substrate.

42 Claims, 15 Drawing Sheets

| | INPUT $In_1$ | INPUT $In_2$ | INPUT $In_3$ | IN OPERATION CONTROL SIGNAL = L | | IN STANDBY CONTROL SIGNAL = H | |
|---|---|---|---|---|---|---|---|
| | | | | GENERATING CIRCUIT | INJECTING CIRCUIT | GENERATING CIRCUIT | INJECTING CIRCUIT |
| SET VALUE $S_1$ | H | H | H | H | L | H | L |
| SET VALUE $S_2$ | L | H | H | L | L | H | L |
| SET VALUE $S_3$ | L | L | H | L | H | H | L |
| | L | L | L | L | H | L | L |

| | INPUT $In_1$ | INPUT $In_2$ | INPUT $In_3$ | INPUT $In_4$ | IN OPERATION CONTROL SIGNAL = L | | | IN STANDBY CONTROL SIGNAL = H | | |
|---|---|---|---|---|---|---|---|---|---|---|
| | | | | | GENERATING CIRCUIT | | INJECTING CIRCUIT | GENERATING CIRCUIT | | INJECTING CIRCUIT |
| | | | | | HIGH SPEED | LOW SPEED | | HIGH SPEED | LOW SPEED | |
| SET VALUE $S_0$ | H | H | H | H | H | L | L | H | L | L |
| SET VALUE $S_1$ | L | H | H | H | L | H | L | H | L | L |
| SET VALUE $S_2$ | L | L | L | H | L | L | H | H | L | L |
| SET VALUE $S_3$ | L | L | L | H | L | L | H | H | L | L |
| | L | L | L | L | L | L | L | L | L | L |

FIG. 13

|  | INPUT $In_1$ | INPUT $In_2$ | IN OPERATION CONTROL SIGNAL = L | | IN STANDBY CONTROL SIGNAL = H | |
|---|---|---|---|---|---|---|
|  |  |  | GENERATING CIRCUIT | INJECTING CIRCUIT | GENERATING CIRCUIT | INJECTING CIRCUIT |
| SET VALUE $S_1$ | H | H | H | L | H | L |
|  | L | H | L | H | H | L |
| SET VALUE $S_2$ | L | L | L | H | L | L |

SUBSTRATE BIAS GENERATOR FOR SEMICONDUCTOR INTEGRATED CIRCUIT DEVICE

BACKGROUND OF THE INVENTION

1. Field of the Invention

The present invention relates to a semiconductor integrated circuit device, and more specifically to a circuit device used to control the threshold value of MOSFETs formed on a semiconductor substrate.

2. Description of the Prior Art

In general, one of effective methods of reducing power consumption of a semiconductor integrated circuit device including MOSFETs is to reduce the supply voltage thereof, in the case of a CMOS integrated circuit in particular. In this method of reducing the supply voltage, however, the operation speed of the CMOS circuit is largely dependent upon the threshold value of the MOS transistors. For instance, when the supply voltage is 3.3V, even if the threshold value increases by 0.15V, the circuit speed is reduced by about 5%. However, when the supply voltage is 1V, the circuit speed is reduced as largely as twice.

Therefore, when not only the supply voltage but also the threshold value are reduced, it is possible to reduce the power consumption during operation, without reducing the circuit speed. When the threshold value is reduced, however, since the sub-threshold current of the MOSFET increases, this causes an increase of power consumption during standby. Therefore, it is desirable to increase the threshold value during standby but to decrease the same during operation.

Further, as described above, when only the supply voltage is reduced, since the dependence of the threshold value upon the circuit speed increases, the variation of the threshold value causes a large variation of the circuit speed. Therefore, it is desirable to reduce the variation of the threshold value during operation.

The threshold value of MOSFET can be modulated on the basis of the substrate potential (back-gate effect). Therefore, when a substrate bias voltage is applied (a potential lower than the source in NMOS but higher than the same in PMOS), threshold value can be increased. By utilizing this phenomenon, a technique of controlling the threshold value is disclosed by Document 1: K Seta, et al., "50% Active-Power Saving without Speed Degradation using Standby Power Reduction (SPR) Circuit", ISSCC Digest of Technical Papers, pp. 318–319, February 1996 or Document 2: T. Kobayashi, et al., "Self-adjusting threshold-voltage scheme (SATS) for low-voltage high-speed operation" Proc. of CICC94, pp. 271–274, May, 1994, for instance.

In Document 1, a disclosed circuit is used to switch the threshold value between during standby and during operation. In Document 2, a disclosed circuit is used to compensate for the variation of the threshold during operation.

However, there has been not yet known a technique of realizing of both: a) to increase the threshold value during standby and to decrease the threshold value during operation and b) to reduce the variation of the threshold value during operation. In other words, in the circuit of Document 1, it is impossible to compensate for the variation of the threshold value during operation. In the circuit of Document 2, it is impossible to increase the threshold value during standby. Further, it is also impossible to combine the circuits of these two disclosed Documents 1 and 2 with each other simply. For instance, although the circuit disclosed by Document 2 can control the threshold value of N-channel MOSFETs (referred to as NMOSs simply, hereinafter) by reducing the potential of the P-type substrate below ground potential GND, the circuit disclosed by Document 1 fixes the potential of the P-type substrate at the ground GND.

Further, in the case of the circuit disclosed by Document 1, there exists another problem in that two supply voltages $V_{PBB}$ (=−2V) and $V_{NBB}$ (=4V) are required in addition to $V_{DD}$ (=2V) and GND (=0V).

SUMMARY OF THE INVENTION

With these problems in mind therefore, it is the object of the present invention to provide a semiconductor integrated circuit device which can control the threshold value at a low value, without increasing the variation thereof, during operation but switch the low threshold value to a high threshold value during standby, without providing any additional voltage supplies.

To achieve the above-mentioned object, the first aspect of the present invention provides a semiconductor integrated circuit device, comprising: a detecting circuit for detecting a physical quantity value corresponding to substrate bias of a semiconductor substrate and for outputting n-units ($n \geq 2$) of first to n-th output signals decided according to a region to which the detected physical quantity value belongs, the region being decided separately on the basis of n-units of the first to n-th set values; a control circuit for outputting drive signals on the bias of a control signal and the first to n-th output signals of said detecting circuit; a substrate potential generating circuit activated on the basis of one of the drive signals of said control circuit, to allow the substrate bias to be deep by pumping out charges from the semiconductor substrate; and a substrate charge injecting circuit activated on the basis of the other of the drive signals of said control circuit, to allow the substrate bias to be shallow by injecting charges to the semiconductor substrate.

Further, the second aspect of the present invention provides the semiconductor integrated circuit device, wherein the control signal is a signal indicative of whether a circuit including MOSFETs formed on the semiconductor substrate is in operation mode or standby mode.

Further, the third aspect of the present invention provides the semiconductor integrated circuit device, wherein the number n of the set values is three or more; said control circuit comprises a Schmitt trigger circuit activated on the basis of one of two output signals of said detecting circuit having two different detected physical quantity values in regions before and after one of two adjacent set values of the n-units of set values and the other of the two output signals of said detecting circuit having two different detected physical quantity values in regions before and after the other of the two adjacent values thereof; and said control circuit generates drive signals on the basis of an output of the Schmitt trigger circuit and (n−2)-units of output signals obtained by subtracting the two output signals from the first to n-th output signals.

Further, the fourth aspect of the present invention provides the semiconductor integrated circuit device, wherein the number n of the set values is three; and said detecting circuit is a substrate potential detecting circuit for detecting potential of the semiconductor substrate, said control circuit operates as follows: 1) when the control signal indicates operation mode and further when the substrate potential is shallower than the first set value as the substrate bias, said control circuit activates said substrate potential generating circuit and deactivates said substrate charge injecting circuit;

2) when the control signal indicates the operation mode and further when the substrate potential is deeper than the first set value as the substrate bias but shallower than the second set value as the substrate bias, said control circuit deactivates both said substrate potential generating circuit and said substrate charge injecting circuit; 3) when the control signal indicates the operation mode and further when the substrate potential is deeper than the second set value as the substrate bias, said control circuit deactivates said substrate potential generating circuit and activates said substrate charge injecting circuit; 4) when the control signal indicates standby mode and further when the substrate potential is shallower than the third set value as the substrate bias, said control circuit activates said substrate potential generating circuit and deactivates said substrate charge injecting circuit; and 5) when the control signal indicates the standby mode and further when the substrate potential is deeper than the third set value as the substrate bias, said control circuit deactivates both said substrate potential generating circuit and said substrate charge injecting circuit.

Further, the fifth aspect of the present invention provides the semiconductor integrated circuit device, wherein the number n of the set values is three; and said detecting circuit is a leak current detecting circuit for detecting leak current of MOSFETs formed on the semiconductor substrate, said control circuit operates as follows: 1) when the control signal indicates operation mode and further when the leak current is larger than the first set value, said control circuit activates said substrate potential generating circuit and deactivates said substrate charge injecting circuit; 2) when the control signal indicates the operation mode and further when the leak current is smaller than the first set value but larger than the second set value, said control circuit deactivates both said substrate potential generating circuit and said substrate charge injecting circuit; 3) when the control signal indicates the operation mode and further when the leak current is smaller than the second set value, said control circuit deactivates said substrate potential generating circuit and activates said substrate charge injecting circuit; 4) when the control signal indicates standby mode and further when the leak current is larger than the third set value, said control circuit activates said substrate potential generating circuit and deactivates said substrate charge injecting circuit; and 5) when the control signal indicates the standby mode and further when the leak current is smaller than the third set value, said control circuit deactivates both said substrate potential generating circuit and said substrate charge injecting circuit.

Further, the sixth aspect of the present invention provides the semiconductor integrated circuit device, wherein the number n of the set values is four; and said detecting circuit is a substrate potential detecting circuit for detecting potential of the semiconductor substrate, said control circuit operates as follows: 1) when the control signal indicates operation mode and further when the substrate potential is shallower than the first set value as the substrate bias, said control circuit activates said substrate potential generating circuit at high speed and deactivates said substrate charge injecting circuit; 2) when the control signal indicates the operation mode and further when the substrate potential is deeper than the first set value as the substrate bias but shallower than the second set value as the substrate bias, said control circuit activates said substrate potential generating circuit at low speed and deactivates said substrate charge injecting circuit; 3) when the control signal indicates the operation mode and further when the substrate potential is deeper than the second set value as the substrate bias but shallower than the third set value as the substrate bias, said control circuit deactivates both said substrate potential generating circuit and said substrate charge injecting circuit; 4) when the control signal indicates the operation mode and further when the substrate potential is deeper than the third set value as the substrate bias, said control circuit deactivates said substrate potential generating circuit and activates said substrate charge injecting circuit; 5) when the control signal indicates standby mode and further when the substrate potential is shallower than the fourth set value as the substrate bias, said control circuit activates said substrate potential generating circuit and deactivates said substrate charge injecting circuit; and 6) when the control signal indicates the standby mode and further when the substrate potential is deeper than the fourth set value as the substrate bias, said control circuit deactivates both said substrate potential generating circuit and said substrate charge injecting circuit.

Further the seventh aspect of the present invention provides the semiconductor integrated circuit device, wherein the number n of the set values is four; and said detecting circuit is a leak current detecting circuit for detecting leak current of MOSFETs formed on the semiconductor substrate, said control circuit operates as follows: 1) when the control signal indicates operation mode and further when the leak current is larger than the first set value, said control circuit activates said substrate potential generating circuit at high speed and deactivates said substrate charge injecting circuit; 2) when the control signal indicates the operation mode and further when the leak current is smaller than the first set value but larger than the second set value, said control circuit activates said substrate potential generating circuit at low speed and deactivates said substrate charge injecting circuit; 3) when the control signal indicates the operation mode and further when the leak current is smaller than the second set value but larger than the third set value, said control circuit deactivates both said substrate potential generating circuit and said substrate charge injecting circuit; 4) when the control signal indicates the operation mode and further when the leak current is smaller than the third set value, said control circuit deactivates said substrate potential generating circuit and activates said substrate charge injecting circuit; 5) when the control signal indicates standby mode and further when the leak current is larger than the fourth set value, said control circuit activates said substrate potential generating circuit and deactivates said substrate charge injecting circuit; and 6) when the control signal indicates the standby mode and further when the leak current is smaller than the fourth set value, said control circuit deactivates both said substrate potential generating circuit and said substrate charge injecting circuit.

Further, the eighth aspect of the present invention provides the semiconductor integrated circuit device, wherein the number n of the set values is two; and said detecting circuit is a substrate potential detecting circuit for detecting potential of the semiconductor substrate, said control circuit operates as follows: 1) when the control signal indicates operation mode and further when the substrate potential is shallower than the first set value as the substrate bias, said control circuit activates said substrate potential generating circuit and deactivates said substrate charge injecting circuit; 2) when the control signal indicates the operation mode and further when the substrate potential is deeper than the first set value as the substrate bias, said control circuit deactivates said substrate potential generating circuit and activates said substrate charge injecting circuit; 3) when the control signal indicates standby mode and further when the substrate potential is shallower than the second set value as the substrate bias, said control circuit activates said substrate potential generating circuit and deactivates said substrate charge injecting circuit; and 4) when the control signal indicates the standby mode and further when the substrate potential is deeper than the second set value as the substrate bias, said control circuit deactivates both said substrate potential generating circuit and said substrate charge injecting circuit.

Further, the ninth aspect of the present invention provides the semiconductor integrated circuit device, wherein the number n of the set values is two; and said detecting circuit is a leak current detecting circuit for detecting leak current of MOSFETs formed on the semiconductor substrate, said control circuit operates as follows: 1) when the control signal indicates operation mode and further when the leak current is larger than the first set value, said control circuit activates said substrate potential generating circuit and deactivates said substrate charge injecting circuit; 2) when the control signal indicates the operation mode and further when the leak current is smaller than the first set value, said control circuit deactivates said substrate potential generating circuit and activates said substrate charge injecting circuit; 3) when the control signal indicates standby mode and further when the leak current is larger than the second set value, said control circuit activates said substrate potential generating circuit and deactivates said substrate charge injecting circuit; and 4) when the control signal indicates the standby mode and further when the leak current is smaller than the second set value, said control circuit deactivates both said substrate potential generating circuit and said substrate charge injecting circuit.

Further, when the P-type semiconductor substrate is used, the substrate charge injecting circuit comprises: a P-channel MOSFET having a source terminal responsive to the drive signal applied by said control circuit, a gate connected to a ground supply voltage, and a substrate connected to a drive supply voltage; and an N-channel MOSFET formed on the P-type semiconductor substrate and having a source terminal connected to the P-type semiconductor substrate, a gate connected to the ground supply voltage, and a drain terminal connected to a drain of the P-channel MOSFET.

Further, when the N-type semiconductor substrate is used, the substrate charge injecting circuit comprises: an N-channel MOSFET having a source terminal responsive to the drive signal applied by said control circuit, a gate connected to a supply voltage, and a substrate connected to a ground supply voltage; and a P-channel MOSFET formed on the N-type semiconductor substrate and having a source terminal connected to the N-type semiconductor substrate, a gate connected to the supply voltage, and a drain terminal connected to a drain of the N-channel MOSFET.

BRIEF DESCRIPTION OF THE DRAWINGS

FIG. 13 is a table for assistance in explaining the operation of the third embodiment;

DETAILED DESCRIPTION OF THE EMBODIMENTS

The embodiments of the semiconductor integrated circuit device according to the present invention will be described hereinbelow with reference to the attached drawings.

In the following description, "a semiconductor substrate" implies a substrate or a well, "the substrate bias is deep"

(i.e., has a larger relative magnitude) implies that when the semiconductor substrate is of P-type substrate or P-type well, the potential of the semiconductor substrate is low; and when the semiconductor substrate is of N-type substrate or N-type well, the potential of the semiconductor substrate is high . . . "the substrate bias is shallow" (i.e., has a larger relative magnitude) implies that the potential is opposite to the case of "the substrate bias is deep"; that is, when the semiconductor substrate is of P-type substrate or P-type well, the potential of the semiconductor substrate is high; and when the semiconductor substrate is of N-type substrate or N-type well, the potential of the semiconductor substrate is low.

Figure 1:
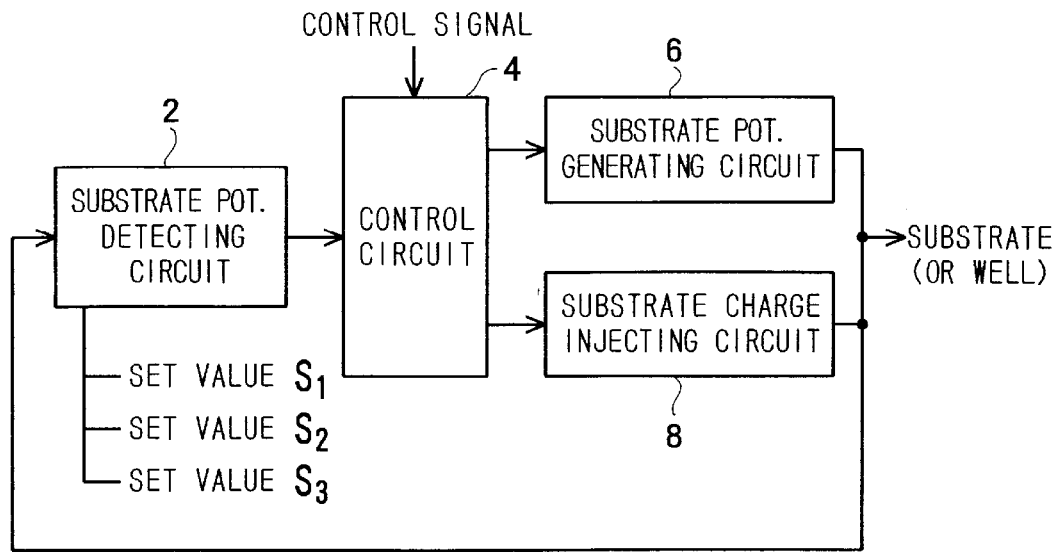
FIG. 1 is a block diagram showing a first embodiment of the semiconductor integrated circuit device according to the present invention.

A first embodiment of the semiconductor integrated circuit device according to the present invention will be described hereinbelow with reference to FIG. 1. The circuit device includes a substrate potential detecting circuit 2, a control circuit 4, a substrate potential generating circuit 6, and a substrate charge injecting circuit 8.

Figure 2A:
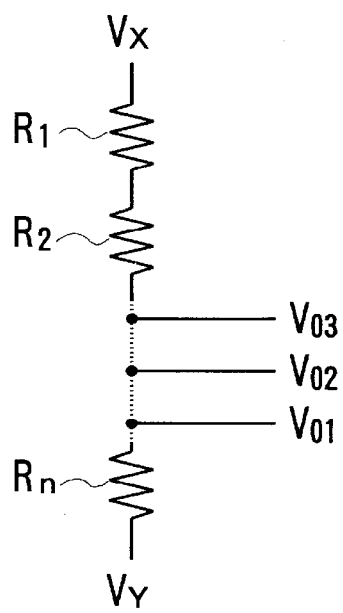
FIGS. 2A and 2B are circuit diagram showing two practical examples of the substrate potential generating circuit related to the present invention.
Figure 2B:
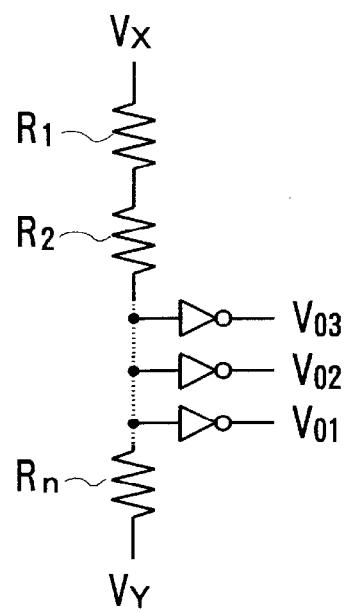

The substrate potential detecting circuit 2 detects the potential (bias voltage) of the semiconductor substrate on which MOSFETs are formed, and outputs three output signals each decided according to a region to which the detected value belongs. Here, each region is decided by three different set values $S_1$, $S_2$ and $S_3$, separately. For instance, this substrate potential detecting circuit 2 can be constructed by a series circuit obtained by connecting a plurality (four or more) resistances $R_1, R_2, \ldots, R_n$ in series, as shown in FIGS. 2A and 2B. Here, when the substrate is of P-type, the three set values are $S_1>S_2>S_3$ as shown in FIG. 2A, and when the substrate is of N-type, the three set values are $S_1<S_2<S_3$ as shown in FIG. 2B. In the series circuit, one ($V_X$) of both terminals thereof is connected to a supply voltage and the other ($V_Y$) of both terminals thereof is connected to the semiconductor substrate. Further, three outputs $V_{O1}$, $V_{O2}$ and $V_{O3}$ are derived from three different intermediate junction nodes, respectively. Now, when the substrate is of P-type, the terminal $V_X$ is connected to a drive supply voltage ($V_{DD}$), and the terminal $V_Y$ is connected to the P-type substrate, as shown in FIG. 2A. Further, when the substrate is of N-type, the terminal $V_X$ is connected to a ground supply voltage, and the terminal $V_Y$ is connected to the N-type substrate, as shown in FIG. 2B. In the N-type substrate, the output signals are derived through an inversion gate, respectively.

Here, in the case of the P-type substrate, the substrate potential detecting circuit 2 shown in FIG. 2A outputs the following potential levels according to the substrate bias:

1) When the substrate bias is shallower than the set value $S_1$, the first to third outputs $V_{O1}$, $V_{O2}$ and $V_{O3}$ of the substrate potential detecting circuit 2 are all at a high (H) level, respectively.

2) When the substrate bias is deeper than the set value $S_1$ but shallower than the set value $S_2$, the first output $V_{O1}$ of the substrate potential detecting circuit 2 is at a low (L) level, and the second and third outputs $V_{O2}$ and $V_{O3}$ thereof are is at H level.

3) When the substrate bias is deeper than the set value $S_2$ but shallower than the set value $S_3$, the first and second outputs $V_{O1}$ and $V_{O2}$ of the substrate potential detecting circuit 2 is at L level, and the third output $V_{O3}$ thereof is at H level.

4) When the substrate bias is deeper than the set value $S_3$, the first to third outputs $V_{O1}$, $V_{O2}$ and $V_{O3}$ of the substrate potential detecting circuit 2 are all at L level.

Further, when the substrate is of N-type, since three outputs $V_{O1}$, $V_{O2}$ and $V_{O3}$ are derived via three inversion gates, respectively as shown in FIG. 2B, the outputs of the substrate potential detecting circuit 2 are the same levels as the above-mentioned results, respectively.

The control circuit 4 drives the substrate potential generating circuit 6 and the substrate charge injecting circuit 8 on the basis of a control signal and the outputs of the substrate potential detecting circuit 2. For instance, the control circuit 4 can be composed of an OR gate 11, a NOR gate 12, and an AND gate 13, as shown in FIG. 3.

Figures 3, 4:
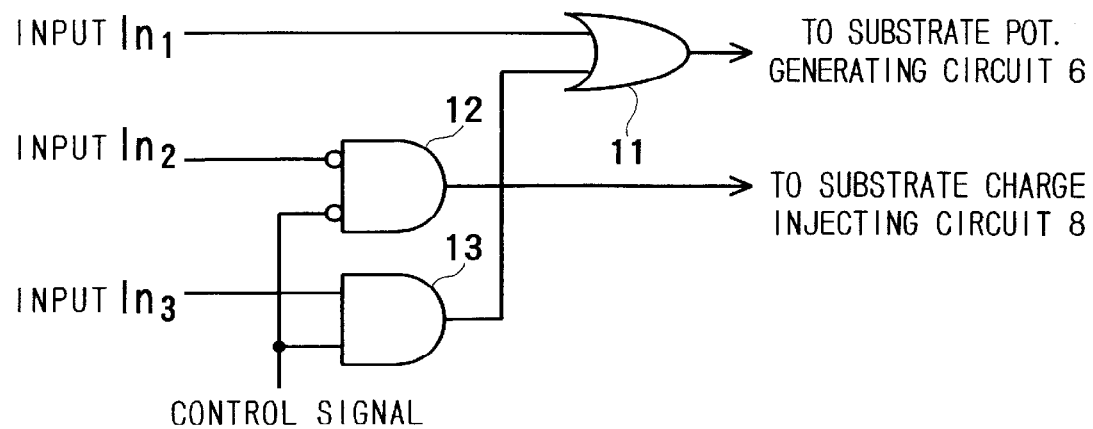
FIG. 3 is a circuit diagram showing a practical example of the control circuit of the first embodiment of the semiconductor integrated circuit device according to the present invention.
FIG. 4 is a table for assistance in explaining the operation of the first embodiment.

In FIG. 3, three inputs $In_1$ to $In_3$ correspond to the first to third outputs of the substrate potential detecting circuit 2, respectively. The OR gate 11 executes a logical sum operation on the basis of the input $In_1$ and an output of the AND gate 13, and drives the substrate potential generating circuit 6 on the basis of the operation result. The NOR gate 12 executes a logical NOR operation on the basis of the input $In_2$ and the control signal, and drives the substrate charge injecting circuit 8 on the basis of the operation result. The AND gate 13 executes a logical product operation on the basis of the input $In_3$ and the control signal, and gives the operation result to the OR gate 11. Further, when a circuit including MOSFETs (whose threshold value is to be controlled) is during operation (referred to as in operation mode, hereinafter), the control signal is at L level, but when the circuit is during standby (referred to as in standby mode, hereinafter), the control signal is at H level. Further, the standby mode includes the ordinary standby mode and a test mode in which circuit current is checked after the circuit including the MOSFETs has been set to the standby mode.

As understood above, during operation (the control signal =L), only when the substrate bias is shallower than the set value $S_1$, the output of the OR gate 11, that is, the input signal (drive signal) applied to the substrate potential generating circuit 6 is at H level; and when the substrate bias is deeper than the set value $S_2$, the output of the NOR gate 12, that is, the input signal (drive signal) applied to the substrate charge injecting circuit 8 is at H level, as listed in FIG. 4. Further, during standby (the control signal =H), only when the substrate bias is shallower than the set value $S_3$, the output applied to the substrate potential generating circuit 6 is H level, and the input (drive signal) applied to the substrate charge injecting circuit 8 is at L level, irrespective of the substrate bias value, as listed in FIG. 4.

When the two drive signals are at H level, both the substrate potential generating circuit 6 and the substrate charge injecting circuit 8 are activated; and when at the L level, both the circuits are deactivated.

Therefore, the first embodiment of the semiconductor integrate circuit device operates according to the control signal and the potential (substrate bias) of the semiconductor substrate as follows:

1) When the control signal is in operation mode and further when the substrate bias is shallower than the set value $S_1$, the substrate potential generating circuit 6 is activated and the substrate charge injecting circuit 8 is deactivated.

2) When the control signal is in operation mode and further when the substrate bias is deeper than the set value $S_1$ but shallower than the set value $S_2$, the substrate potential generating circuit 6 and the substrate charge injecting circuit 8 are both deactivated.

3) When the control signal is in operation mode and further when the substrate bias is deeper than the set value $S_2$, the substrate potential generating circuit 6 is deactivated and the substrate charge injecting circuit 8 is activated.

4) When the control signal is in standby mode and further when the substrate bias is shallower than the set value $S_3$, the substrate potential generating circuit 6 is activated and the substrate charge injecting circuit 8 is deactivated.

5) When the control signal is in standby mode and further when the substrate bias is deeper than the set value $S_3$, the substrate potential generating circuit 6 and the substrate charge injecting circuit 8 are both deactivated.

Here, the substrate potential generating circuit 6 changes the substrate bias on the basis of the drive signal applied by the control circuit 4. When the drive signal is at H level, since the substrate potential generating circuit 6 is activated, the substrate bias becomes deep. When the drive signal is at L level, since the substrate potential generating circuit 6 is deactivated, the output thereof has a high impedance. The practical examples of the substrate potential generating circuit 6 will be described hereinbelow with reference to FIGS. 5A and 5B, in which FIG. 5A is applied to the P-type semiconductor substrate and FIG. 5B is applied to the N-type semiconductor substrate, respectively.

Figure 5A:
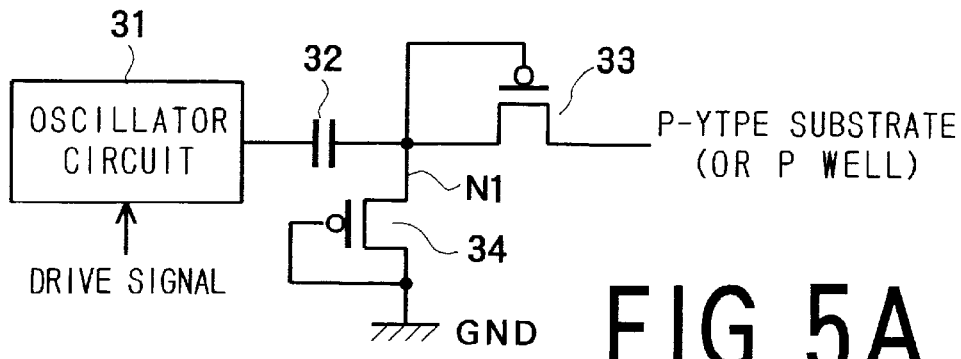
FIGS. 5A and 5B are circuit diagram showing two practical examples of the substrate potential generating circuit related to the present invention.
Figure 5B:
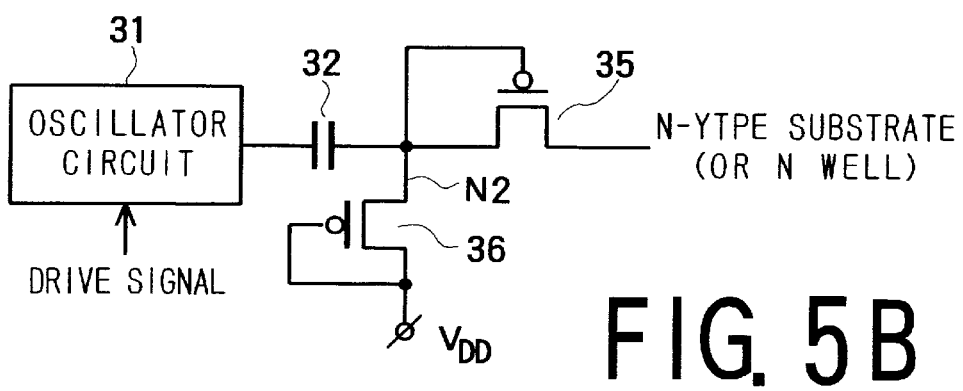

The substrate potential generating circuit 6 applied to the P-type substrate is composed of an oscillator circuit 31 for generating a pulse voltage on the basis of a drive signal, a capacitor 32, and two PMOS transistors 33 and 34, as shown in FIG. 5A.

When the drive signal is at H level, the oscillator circuit (e.g., ring oscillator) 31 is activated to periodically change the potential at one end of the capacitor 32 connected to the output of the oscillator circuit 31, so that a junction node N1 between the two PMOS transistors 33 and 34 (connected to the other end of the capacitor 32) changes in the same way. Here, when the potential at the node N1 drops below the sum of the potential of the P-type semiconductor substrate and the threshold value of the PMOS transistor 33, since the PMOS transistor 33 is turned on, current flows from the P-type semiconductor substrate to the node N1. In this case, the PMOS transistor 34 is kept turned off. However, when the potential at the node N1 rises beyond the threshold value of the PMOS transistor 34 by the oscillator circuit 31, since the PMOS transistor 34 is turned on, current flows from the node N1 to the ground supply voltage GND. In this case, the PMOS transistor 33 is kept turned off. By repeating the above-mentioned operation, since electrons are injected from the ground supply voltage GND to the P-type semiconductor substrate, the potential of the P-type semiconductor substrate drops; that is, the substrate bias becomes deep.

On the other hand, when the drive signal is at L level, since the oscillating circuit 31 is deactivated, the potential at the node N1 is an intermediate potential between the potential of the P-type semiconductor substrate and the ground potential GND, so that both the PMOS transistors 33 and 34 are turned off. As a result, the output of the substrate potential generating circuit 6 has a high impedance.

The substrate potential generating circuit 6 applied to the N-type substrate is composed of an oscillator circuit 31 for generating a pulse voltage on the basis of the drive signal, a capacitor 32, and two NMOS transistors 35 and 36, as shown in FIG. 5B.

When the drive signal is at H level, the substrate potential generating circuit 6 is activated in such a way that electrons are injected from the N-type semiconductor substrate to the drive supply voltage $V_{DD}$, so that the potential of the N-type semiconductor substrate becomes high, that is, the substrate bias becomes deep. When the drive signal is at L level, the two NMOS transistors 35 and 36 are both turned off, so that both the outputs thereof have a high impedance, respectively.

Figure 23A:
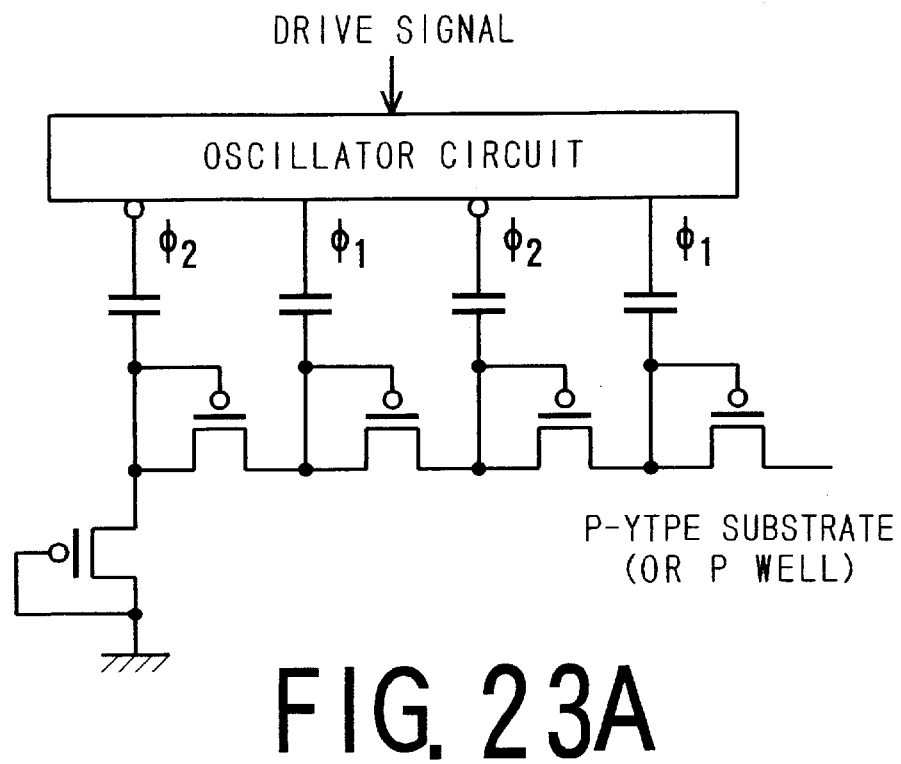
FIGS. 23A and 23B are circuit diagram showing two other practical examples of the substrate potential generating circuit.
Figure 23B:
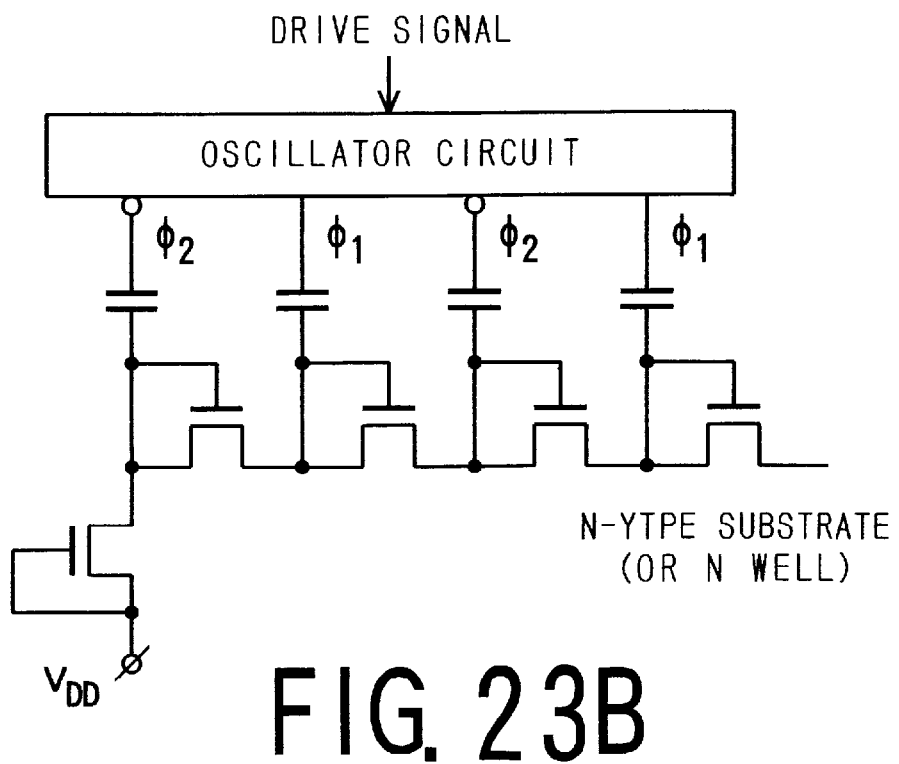

Further, when a deeper substrate bias is required, in the case of the P-type semiconductor substrate, a multistage PMOS transistor (e.g., four transistors) is connected to the oscillator circuit, as shown in FIG. 23A; and in the case of the N-type semiconductor substrate, a multi-stage NMOS transistor (e.g., four transistors) is connected to the oscillator circuit, as shown in FIG. 23B. In this case, the outputs of the two adjacent outputs $\phi_1$ and $\phi_2$ of the oscillator circuit are different 180 degrees out of phase with respect to each other to drive the MOS transistors alternately and mutually.

On the other hand, the substrate charge injecting circuit 8 is activated on the basis of the output signal (i.e., the drive signal) of the control circuit 4 as follows: when the drive signal is at H level, the substrate bias is shallow and when the drive signal is at L level, the output thereof has a high impedance.

Figures 6A, 6B:
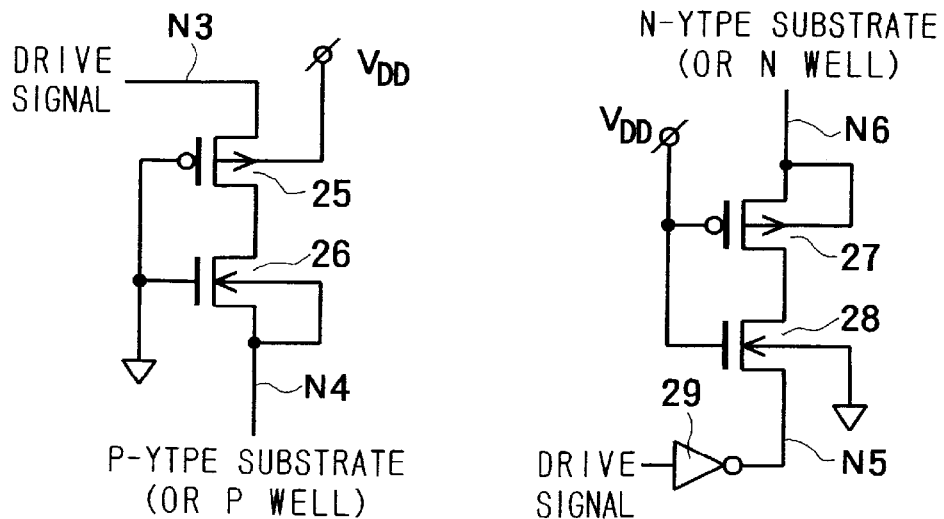
FIGS. 6A and 6B are circuit diagram showing two practical examples of the substrate charge injecting circuit related to the present invention.

The practical examples of the substrate charge injecting circuit 8 will be described hereinbelow with reference to FIGS. 6A and 6B, in which FIG. 6A is applied to the P-type semiconductor substrate and FIG. 6B is applied to the N-type semiconductor substrate.

The substrate charge injecting circuit 8 applied to the P-type substrate is composed of a PMOS transistor 25 and an NMOS transistor 26 connected in series, as shown in FIG. 6A. The gate of the PMOS transistor 25 is grounded and the substrate (well) thereof is connected to the drive supply voltage $V_{DD}$. Further, the gate of the NMOS transistor 26 is grounded and the substrate (well) thereof is connected to the source thereof. When the drive signal is at H level, since the PMOS transistor 25 is turned on, current flows from a node N3 (the source of the PMOS transistor 25) to the source of the NMOS transistor 26, that is, a node N4 connected to the P-type substrate. Therefore, the potential at the P-type substrate rises; in other words, the substrate bias becomes shallow. Further, when the drive signal is at L level, since the PMOS transistor 25 is turned off, the node N4 is in a high impedance status.

The substrate charge injecting circuit 8 applied to the N-type substrate is composed of a PMOS transistor 27 and an NMOS transistor 28 connected in series, as shown in FIG. 6B. The gate of the PMOS transistor 27 is connected to the drive supply voltage $V_{DD}$, and the source (node $N_6$) is connected to the semiconductor substrate. Further, the drain of the PMOS transistor 27 is connected to the drain of the NMOS transistor 28. The gate of the NMOS transistor 28 is connected to the drive supply voltage $V_{DD}$, and the source thereof is responsive to the drive signal via an inversion gate 29. Further, the substrate (well) of the NMOS transistor 28 is grounded. When the drive signal is at L level, since the NMOS transistor 28 is turned on, current flows from the N-type substrate connected to the source of the PMOS transistor 27 to a node N5 (the source of the NMOS transistor 28), so that the potential at the N-type substrate drops; in other words, the substrate bias becomes shallow. On the other hand, when the drive signal is at H level, since the NMOS transistor 28 is turned off, the node N5 is in a high impedance status.

As described above, in the first embodiment of the semiconductor integrated circuit device according to the present invention, when the two set values $S_1$ and $S_2$ are determined at two adjacent values respectively, it is possible to set the substrate potential to the set value $S_1$ in operation mode and to the set value $S_3$ in standby mode. For instance, when the substrate is of P-type and further when $S_1$ is −0.5V; $S_2$ is −0.7V; and $S_3$ is −3.3V, the substrate potential is set to −0.5V in operation mode. However, when the operation mode changes to the standby mode, since the substrate potential generating circuit 6 is activated to allow the substrate bias to be deep and sets the substrate bias to −3.3V finally. After that, when the standby mode changes to the operation mode, since the substrate charge injecting circuit 8 activated to allow the substrate bias to be shallow, the substrate bias is set to −0.5V finally.

Therefore, owing to the above-mentioned operation, it is possible to control the threshold value of the semiconductor integrated circuit device to a low value of less variation in operation mode and to switch the threshold value thereof to a high value in standby mode. Further, it is unnecessary to provide an additional external voltage supplies.

Figure 7:
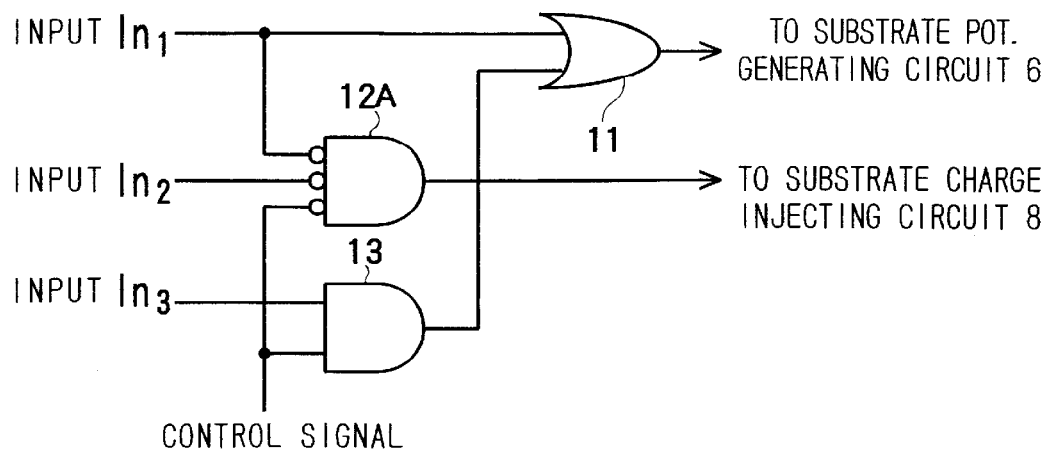
FIG. 7 is a circuit diagram showing another practical example of the control circuit of the first embodiment of the semiconductor integrated circuit device according to the present invention.

Further, in the above-mentioned first embodiment, the control circuit 4 as shown in FIG. 3 is used. Without being limited only thereto, another control circuit as shown in FIG. 7 can be also used. In the control circuit shown in FIG. 7, the two-input NOR gate 12 shown in FIG. 3 is replaced with a three-input NOR gate 12A, in which the three input signals are the first and second outputs (correspond to the input In$_1$ and the input In$_2$, respectively) of the substrate potential detecting circuit 2 and the control signal.

Figure 24:
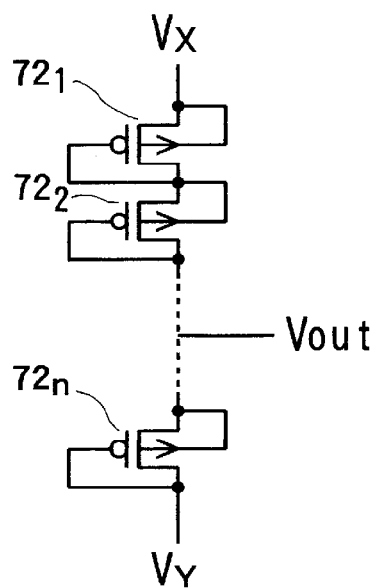
FIG. 24 is a circuit diagram showing another practical example of the substrate potential detecting circuit.

Further, in the above-mentioned first embodiment, the substrate potential detecting circuit 2 is composed of the n-units of resistors connected in series to each other as shown in FIGS. 2A and 2B. Without being limited only thereto, however, it is possible to construct the substrate potential detecting circuit by use of n-units of PMOS transistors $72_1, \ldots, 72_n$, as shown in FIG. 24, in which only a single output signal $V_{out}$ is shown. In FIG. 24, the PMOS transistors operate in a sub-threshold region, respectively.

Figures 25A, 25B:
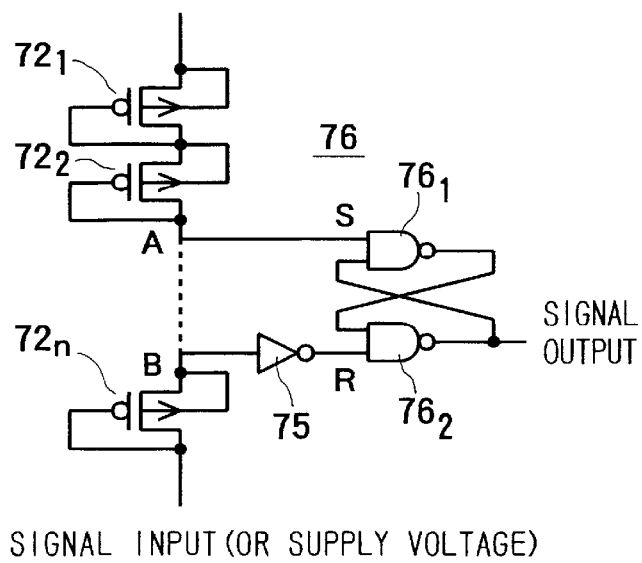
FIGS. 25A and 25B are circuit diagram showing two other practical examples of the substrate potential detecting circuit.

Further, as shown in FIGS. 25A and 25B, the substrate potential detecting circuit can be constructed by use of a MOS transistor train composed of n-units connected in series, an inversion gate 75, and an RS flip-flop 76 made up of two cross-connected NAND gates $76_1$ and $76_2$. Further, in FIG. 25A, two junction nodes A and B denote the two different junction nodes of the transistor train.

Figures 26A, 26B:
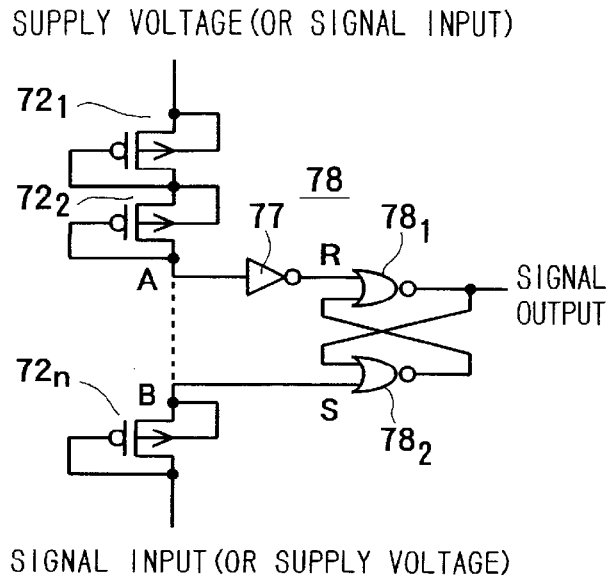
FIGS. 26A and 26B are circuit diagram showing two other practical examples of the substrate potential detecting circuit.

Further, as shown in FIGS. 26A and 26B, the substrate potential detecting circuit can be constructed by connecting an inversion gate 77 and an RS flip-flop circuit 78 composed of two cross-connected NOR gates $78_1$ and $78_2$, to the substrate potential detecting circuit shown in FIG. 24 additionally.

Figure 27:
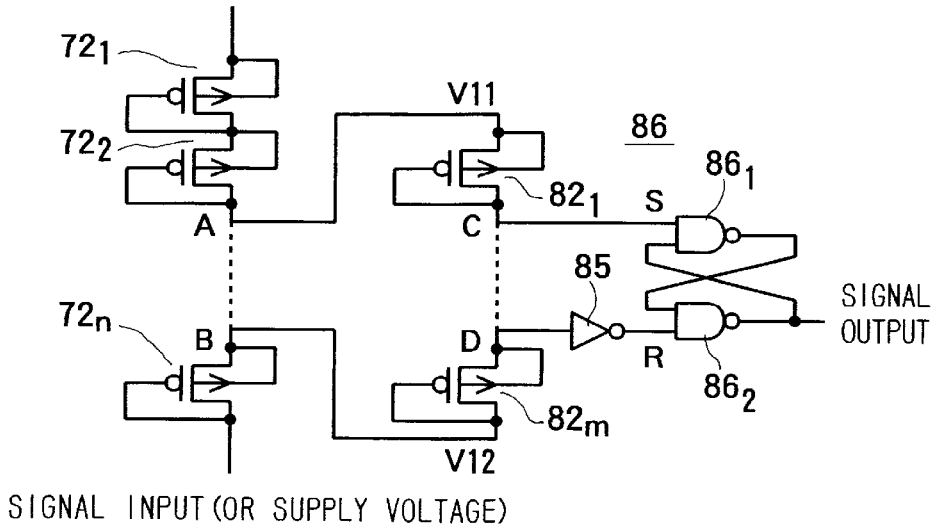
FIG. 27 is a circuit diagram showing still another practical example of the substrate potential detecting circuit.

Further, as shown in FIG. 27, the substrate potential detecting circuit can be constructed by the first transistor train composed of n-units of PMOS transistors $72_1, \ldots, 72_n$ connected in series, a second transistor train composed of m-units of PMOS transistors $82_1, \ldots, 82_n$ connected in series and connected between two different junction noses A and B of the first transistor train, an inversion gate 85, and an RS flip-flop 86 made up of two cross-connected NAND gates $86_1$ and $86_2$. In FIG. 27, all the PMOS transistors operate in the sub-threshold region, respectively. Further, in FIG. 27, the substrate potential detecting circuit can be constructed by removing the inversion gate 85 and the RS flip-flop circuit 86.

Further, in the substrate potential detecting circuits shown in FIGS. 24 to 27, although only the single output signal is shown, it is of course possible to derive a plurality of the output signals from each of these substrate potential detecting circuits, as disclosed by Japanese Patent Application No. 8-11529 filled by the same Applicant.

Further, in the substrate potential detecting circuits shown in FIGS. 24 to 27, although only P-channel MOS transistors are used, it is of course possible to construct the same detecting circuit by use of N-channel MOS transistors, respectively.

Figure 8:
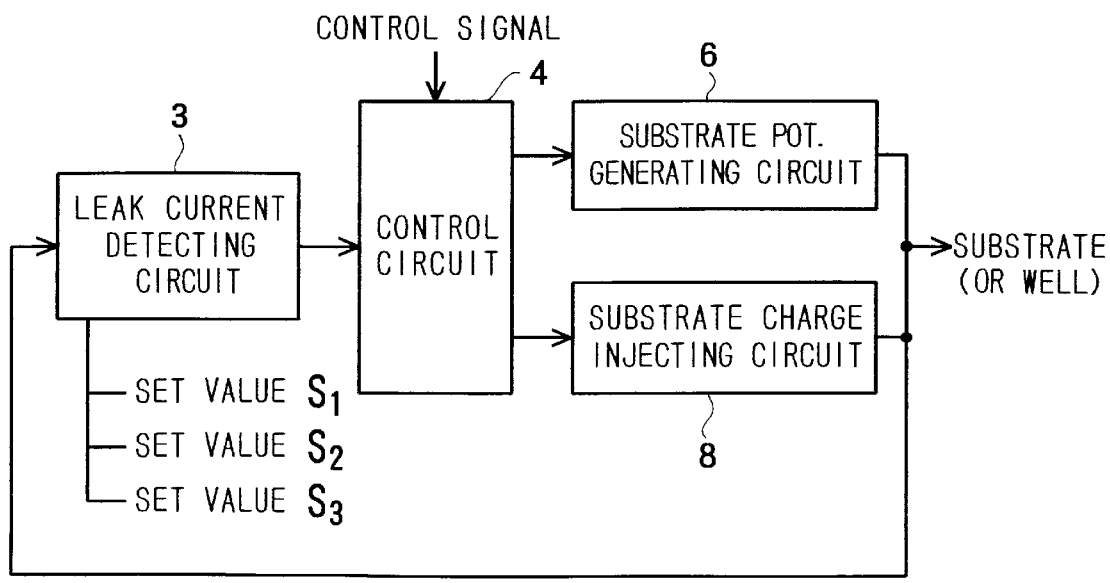
FIG. 8 is a block diagram showing a second embodiment of the semiconductor integrated circuit device according to the present invention.

A second embodiment of the semiconductor integrated circuit device according to the present invention will be described hereinbelow with reference to FIG. 8. In this second embodiment, the substrate potential detecting circuit 2 of the first embodiment shown in FIG. 1 is replaced with a leak current detecting circuit 3. The leak current detecting circuit 3 detects the leak current of the MOSFETs formed on the same substrate, and outputs three output signals each decided according to a region to which the detected value belongs. Here, each region is decided separately by three different set values $S_1$, $S_2$ and $S_3$. In this case, when the substrate bias becomes shallow or deep, since the leak current of the MOSFETs increases or decreases, respectively, it is possible to obtain the same effect as with the case of the first embodiment.

Figure 9:
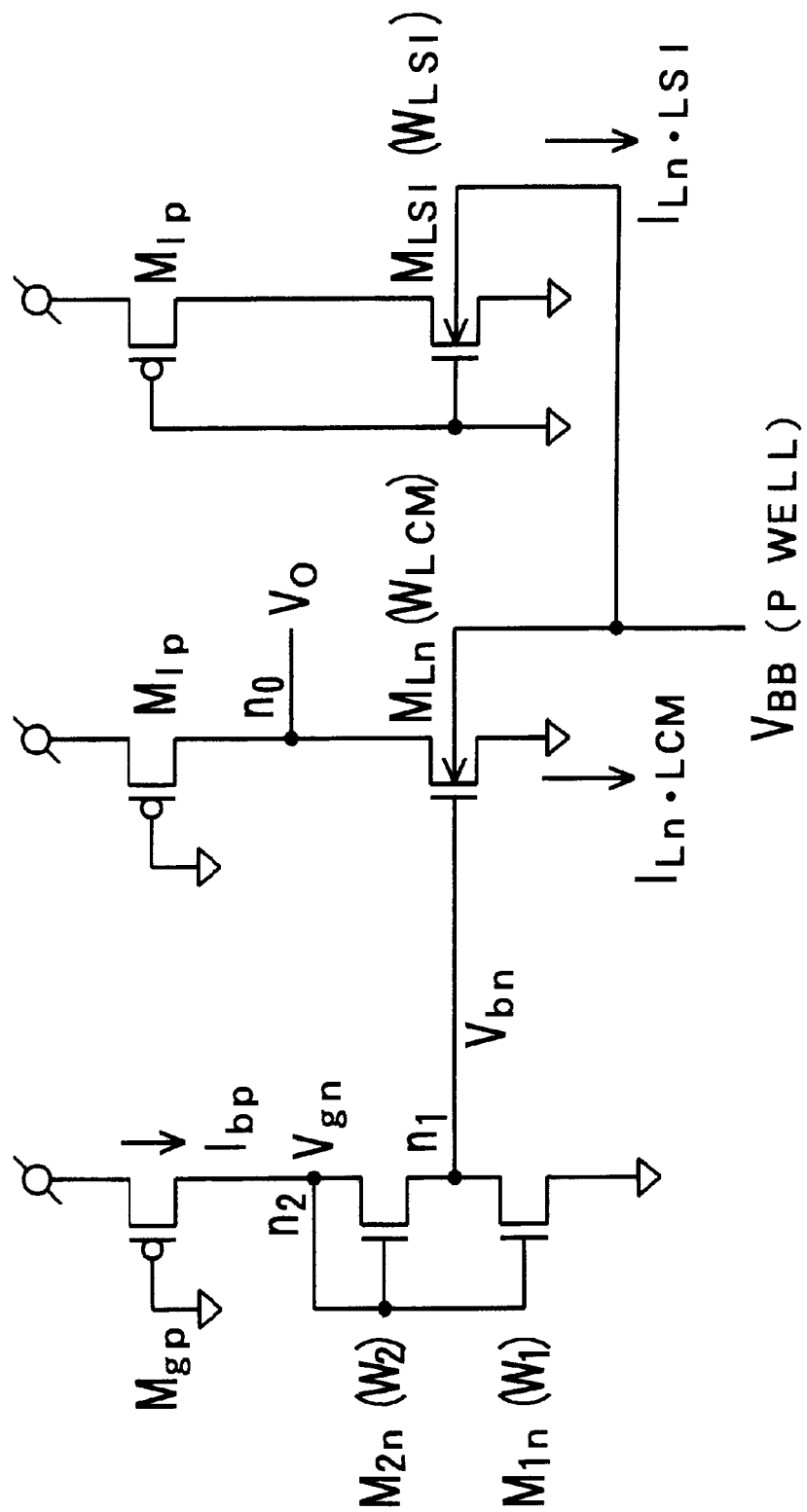
FIG. 9 is a circuit diagram showing a practical example of the leak current detecting circuit related to the second embodiment.

Further, a practical example of the leak current detecting circuit 3 is shown in FIG. 9, which has been disclosed in detail by Japanese Patent Application No. 7-225576 filled by the same Applicant.

In the leak current detecting circuit 3 shown in FIG. 9, a leak current detecting N-channel MOS transistor $M_{Ln}$ is provided for an N-channel MOS transistor $M_{LSI}$ which represents an LSI equivalently. Further, two MOS transistors $M_{1n}$ and $M_{2n}$ are connected to the N-channel MOS transistor $M_{Ln}$ to generate a gate voltage $V_{bn}$ of the N-channel MOS transistor $M_{Ln}$. In more detail, a source terminal of the N-channel MOS transistor $M_{1n}$ is grounded. A drain terminal of the N-channel MOS transistor $M_{1n}$ is connected to a source terminal of the N-channel MOS transistor $M_{2n}$. A drain terminal of the N-channel MOS transistor $M_{2n}$ is connected to a current source $M_{gp}$. Further, two gate terminals of the two N-channel MOS transistors $M_{1n}$ and $M_{2n}$ and the two drain terminals of the two transistors $M_{1n}$ and $M_{gp}$ are connected to each other at a junction node $n_2$. Further, a junction point $n_1$ between the drain terminal of the N-channel MOS transistor $M_{1n}$ and the source terminal of the N-channel MOS transistor $M_{2n}$ is connected to the gate terminal of the N-channel MOS transistor $M_{Ln}$.

Here, the current value $I_{bp}$ of the current source $M_{gp}$ and the channel widths of both the N-channel MOS transistors $M_{1n}$ and $M_{2n}$ are selected in such a way that the two N-channel MOS transistors $M_{1n}$ and $M_{2n}$ operate in a subthreshold region, respectively. When set as described above, a potential difference between the gate terminal potential $V_{gn}$ of the N-channel MOS transistor $M_{1n}$ and the ground potential GND becomes equal to or lower than the threshold voltage of the two N-channel MOS transistors $M_{1n}$ and $M_{2n}$.

Figure 10:
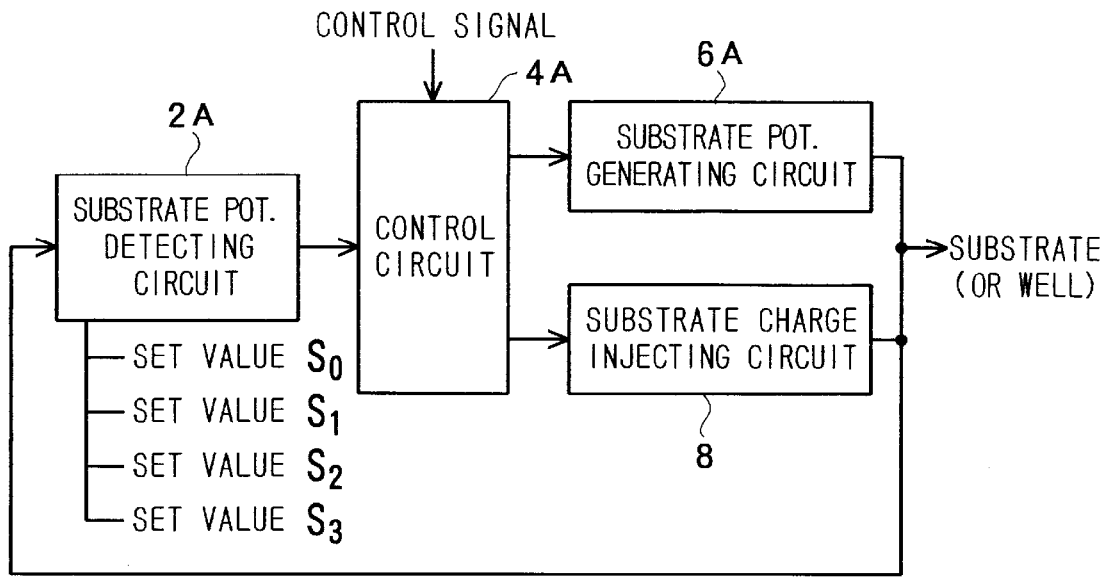
FIG. 10 is a block diagram showing a third embodiment of the semiconductor integrated circuit device according to the present invention.

A third embodiment of the semiconductor integrated circuit device according to the present invention will be described hereinbelow with reference to FIG. 10. In FIG. 10, the substrate potential detecting circuit 2, the control circuit 4 and the substrate potential generating circuit 6 all shown in FIG. 1 are replaced with a substrate potential detecting circuit 2A, a control circuit 4A, and a substrate potential generating circuit 6A, respectively.

The substrate potential detecting circuit 2A detects the potential (bias voltage) of the semiconductor substrate on which MOSFETs are formed, and outputs first to fourth output signals each decided according to a region to which the detected value belongs. Here, each region is decided separately by four different set values $S_1$, $S_2$, $S_3$ and $S_4$. In more detail, when the substrate bias is shallower than the set value $S_0$, the first to fourth output signals are all at H level; when the substrate bias is deeper than the set value So but shallower than the set value $S_1$, the first output signal is at L level and the second to fourth output signals are all at H level; when the substrate bias is deeper than the set value $S_1$ but shallower than the set value $S_2$, the first and second output signals are both at L level and the third and fourth output signals are both at H level; when the substrate bias is deeper than the set value $S_2$ but shallower than the set value $S_3$, the first to third output signals are all at L level and the fourth output signal is at H level; and when the substrate bias is deeper than the set value $S_3$, the first to fourth output signals are all at L level.

On the other hand, the control circuit 4A drives the substrate potential generating circuit 6A and the substrate charge injecting circuit 8 on the basis of a control signal and the first to fourth outputs applied by the substrate potential detecting circuit 2A. For instance, the control circuit 4A is composed of an OR gate 14, an AND gate 15, a NOR gate 16 and an AND gate 17, as shown in FIG. 11.

Figure 11:
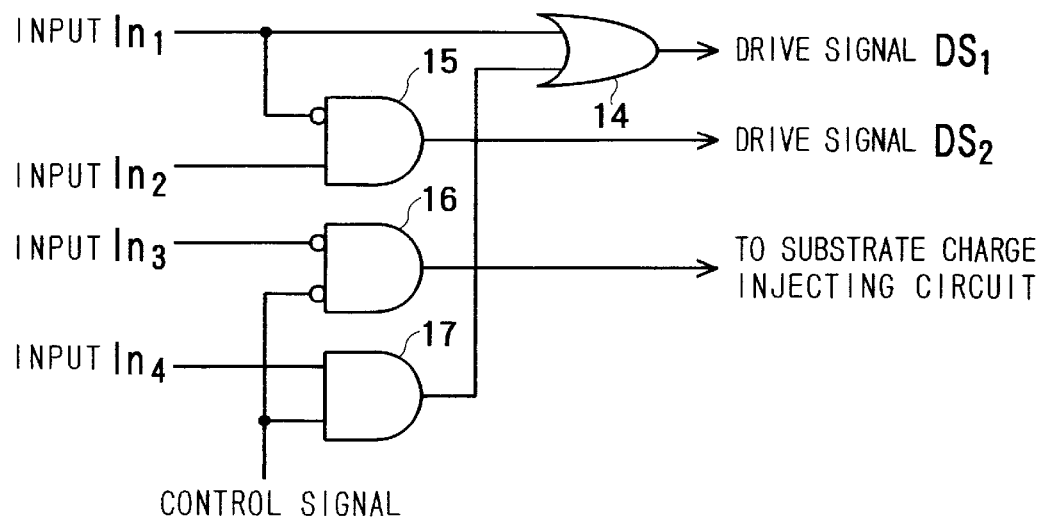
FIG. 11 is a circuit diagram showing a practical example of the control circuit related to the third embodiment.

In FIG. 11, four inputs $In_1$ to $In_4$ correspond to the first to fourth outputs of the substrate potential detecting circuit 2A, respectively.

The OR gate 14 executes a logical sum operation on the basis of the input $In_1$ and an output of the AND gate 17, and applies the operation result (i.e., a drive signal $DS_1$) to the substrate potential generating circuit 6A. The AND gate 15 executes the logical product operation on the basis of an inversion signal of the input $In_1$ and the input $In_2$, and applies the operation result (i.e., a drive signal $DS_2$) to the substrate potential generating circuit 6A. The NOR gate 16 executes a logical NOR operation on the basis of the input $In_3$ and the control signal, and drives the substrate charge injecting circuit 8 on the basis of the operation result. The AND gate 17 executes a logical product operation on the basis of the input $In_4$ and the control signal, and applies the operation result to the OR gate 14.

Figure 12:
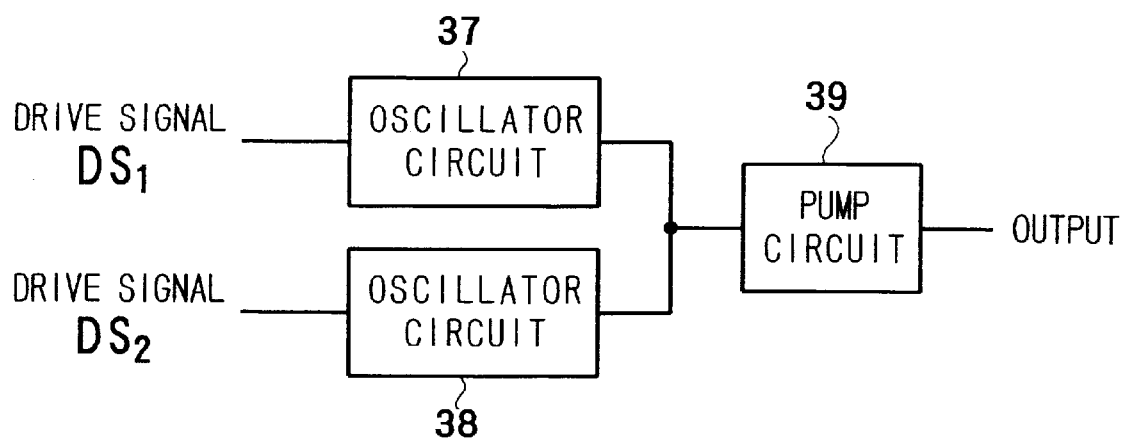
FIG. 12 is a block diagram showing the substrate potential generating circuit related to the third embodiment.

As shown in FIG. 12, the substrate potential generating circuit 6A is composed of a first oscillator circuit 37, a second oscillator circuit 38, and a pump circuit 39. The first oscillator circuit 37 is activated when the drive signal $DS_1$ is at H level but deactivated when at L level. Further, the second oscillator circuit 38 is activated when the drive signal $DS_2$ is at H level but deactivated when at L level. Further, the first oscillator circuit 37 operates at a speed higher than that of the second oscillator 38.

When the semiconductor substrate is of P-type, the pump circuit 39 is the same as that obtained by removing only the oscillator circuit 31 from the circuit shown in FIG. 5A. Further, when the semiconductor substrate is of N-type, the pump circuit 39 is the same as that obtained by removing only the oscillator circuit 31 from the circuit shown in FIG. 5B.

Therefore, when the drive signal $DS_1$ is at H level, since the substrate potential generating circuit 6A is activated at high speed so that the substrate bias becomes deep quickly. When the drive signal $DS_2$ is at H level, on the other hand, since the substrate potential generating circuit 6A is activated at low speed so that the substrate bias becomes deep slowly. Further, when both the drive signals $DS_1$ and $DS_2$ are both L level, since the substrate potential generating circuit 6A is deactivated, the output thereof has a high impedance.

Further, in the same way as with the case of the first embodiment, when the output signal of the NOR gate 16 shown in FIG. 11 is at H level, since the substrate charge injecting circuit 8 is activated in response to this H level, the substrate bias becomes shallow. On the other hand, when at L level, since the substrate charge injecting circuit 8 is deactivated, the output thereof has a high impedance.

The third embodiment of the semiconductor integrated circuit device operates on the basis of the control signal and the substrate bias as follows:

1) When the control signal is in operation mode and further the substrate bias is shallower than the set value $S_0$, the substrate potential generating circuit 6A is activated at high speed, and the substrate charge injecting circuit 8 is deactivated.

2) When the control signal is in operation mode and further the substrate bias is deeper than the set value $S_0$ but shallower than the set value $S_1$, the substrate potential generating circuit 6A is activated at low speed, and the substrate charge injecting circuit 8 is deactivated.

3) When the control signal is in operation mode and further the substrate bias is deeper than the set value $S_1$ but shallower than the set value $S_2$, the substrate potential generating circuit 6A and the substrate charge injecting circuit 8 are both deactivated.

4) When the control signal is in operation mode and further the substrate bias is deeper than the set value $S_2$, the substrate potential generating circuit 6A is deactivated, and the substrate charge injecting circuit 8 is activated.

5) When the control signal is in standby mode and further the substrate bias is shallower than the set value $S_3$, the substrate potential generating circuit 6A is activated at high speed, and the substrate charge injecting circuit 8 is deactivated.

6) When the control signal is in standby mode and further the substrate bias is deeper than the set value $S_3$, the substrate potential generating circuit 6A and the substrate charge injecting circuit 8 are both deactivated.

FIG. 13 shows a table which lists the above-mentioned operation results.

In this third embodiment, since the number of the set values increases by one, it is possible to improve the controllability of the substrate bias in operation mode. This will be described hereinbelow in more detail. First, the first embodiment will be considered. For instance, when the substrate bias is determined deep at high speed, although the substrate bias reaches the set value $S_1$ soon, since the substrate bias reaches the set value $S_2$ before the substrate potential generating circuit 6 is deactivated, the substrate charge injecting circuit 8 is activated. As a result, the substrate potential drops to the set value $S_1$, and soon the substrate potential generating circuit 6 is activated again before the substrate charge injecting circuit 8 is deactivated. Therefore, there exists a possibility that the similar operation as above is repeated. Accordingly, it is preferable to reduce the speed of deepening the substrate bias by the substrate potential generating circuit 6 in the vicinity of the set value $S_1$ from the standpoint of controllability. On the other hand, immediately after the supply voltage is applied to the integrated circuit, since the substrate bias is very shallow, it is necessary to apply the substrate bias at high speed. On the basis of the above-mentioned reason, in this third embodiment, since the set value $S_0$ is additionally set before the set value $S_1$, it is possible to control the substrate potential generating circuit 6 in such a way that the driving capability is large at first but decreases soon.

Further, in the third embodiment of the semiconductor integrated circuit device, when the control signal is in standby mode and the substrate bias is shallower than the set value $S_3$, although the substrate potential generating circuit 6A is activated at high speed, it is possible to activate the same circuit 6A at low speed.

Figure 14:
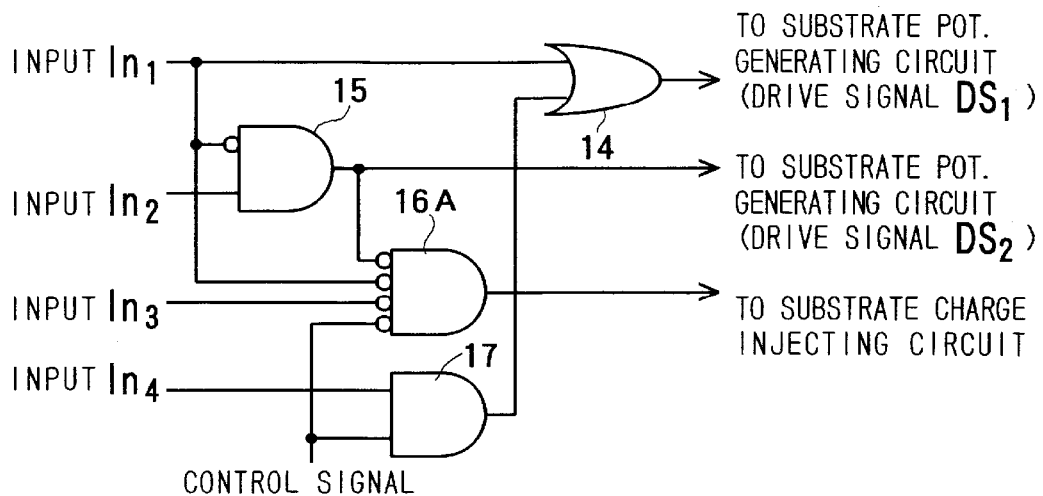
FIG. 14 is a circuit diagram showing a practical example of the other control circuit related to the third embodiment.

Further, in the third embodiment, although the control circuit 4A as shown in FIG. 11 is used, it is possible to replaced the two-input NOR gate 16 shown in FIG. 11 with a four-input NOR gate 16A as shown in FIG. 14. In this case, the four inputs of the NOR gate 16A are the three inputs $In_1$, $In_2$ and $In_3$ and the control signal. Therefore, the NOR operation is executed on the basis of these four signals, and the operated result is applied to the substrate charge injecting circuit 8.

Figure 15:
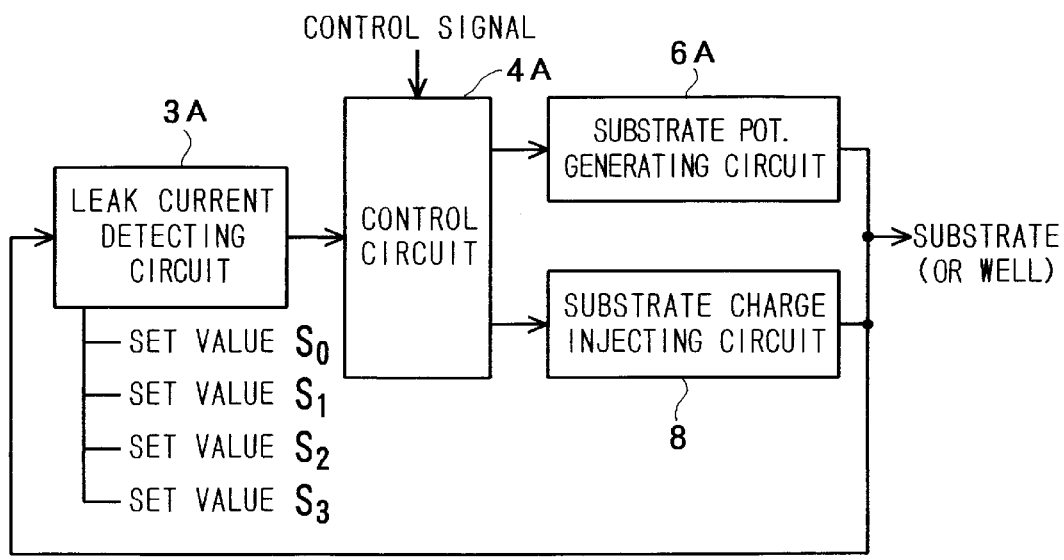
FIG. 15 is a block diagram showing a fourth embodiment of the present invention.

A fourth embodiment of the semiconductor integrated circuit device according to the present invention will be described hereinbelow with reference to FIG. 15. In this fourth embodiment, the substrate potential detecting circuit 2A of the third embodiment shown in FIG. 10 is replaced with a leak current detecting circuit 3A. The leak current detecting circuit 3A detects the leak current of the MOSFETs formed on the same substrate, and outputs four output signals each decided according to a region to which the detected value belongs. Here, each region is decided separately by four different set values $S_0$, $S_1$, $S_2$ and $S_3$. In this case, it is of course possible to obtain the same effect as with the case of the third embodiment.

Figure 16:
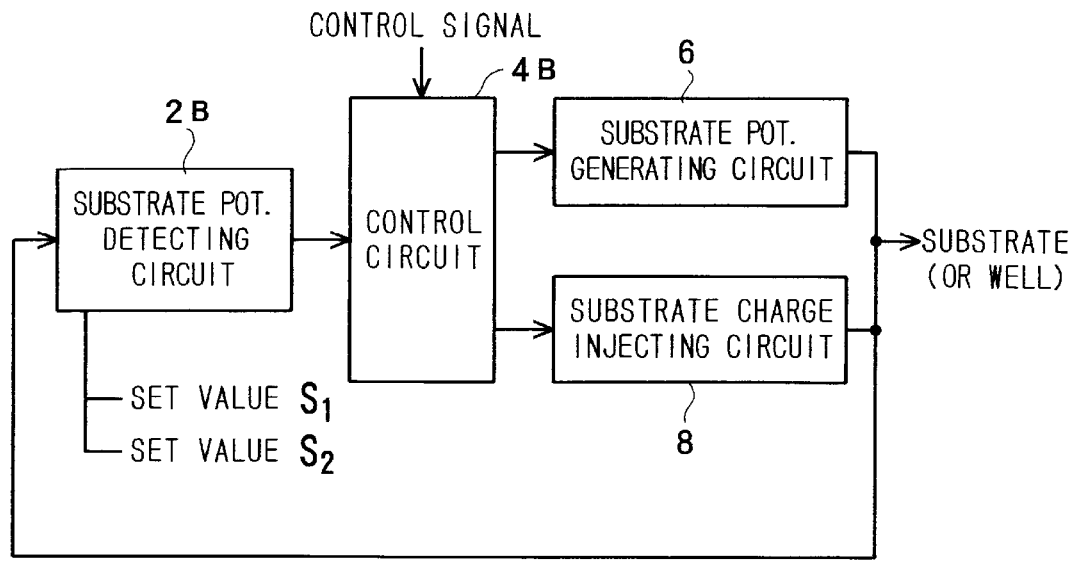
FIG. 16 is a block diagram showing a fifth embodiment of the present invention.

A fifth embodiment of the semiconductor integrated circuit device according to the present invention will be described hereinbelow with reference to FIG. 16. In FIG. 16, the substrate potential detecting circuit 2 and the control circuit 4 both shown in FIG. 1 are replaced with a substrate potential detecting circuit 2B and a control circuit 4B, respectively.

The substrate potential detecting circuit 2B detects the potential (bias voltage) of the semiconductor substrate on which MOSFETs are formed, and outputs first and second output signals each decided according to a region to which the detected value belongs. Here, each region is decided separately by two set values $S_1$ and $S_2$. In more detail, when the substrate bias is shallower than the set value $S_1$, the first and second output signals are both at H level, and when the substrate bias is deeper than the set value $S_1$ but shallower than the set value $S_2$, the first output signal is at L level and the second output signal is at H level. Further, when the substrate bias is deeper than the set value $S_2$, the first and second output signals are both at L level.

Figure 17:
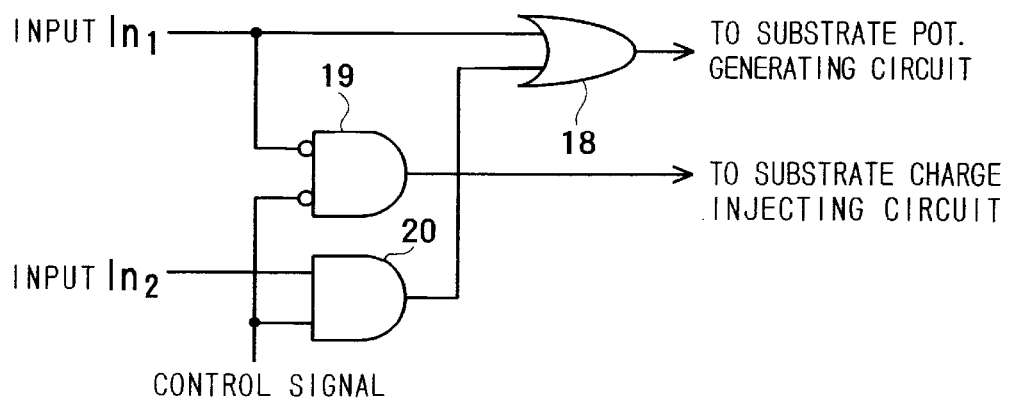
FIG. 17 is a circuit diagram showing a practical example of the control circuit related to the fifth embodiment.

On the other hand, the control circuit 4A drives the substrate potential generating circuit 6 and the substrate charge injecting circuit 8 on the basis of a control signal and the first to second outputs applied by the substrate potential detecting circuit 2B. As shown in FIG. 17, for instance, the control circuit 4B is composed of an OR gate 18, a NOR gate 19, and an AND gate 20. In FIG. 17, two inputs $In_1$ and $In_2$ correspond to the first and second outputs of the substrate potential detecting circuit 2B, respectively.

The OR gate 18 executes a logical OR operation on the basis of the input $In_1$ and an output of the AND gate 20, and applies the operation result to the substrate potential generating circuit 6. The NOR gate 19 executes a logical NOR operation on the basis of the input $In_1$ and the control signal, and applies the operation result to the substrate charge injecting circuit 8. The AND gate 20 executes the logical AND operation on the basis of the input $In_2$ and the control signal, and applies the operation result to the OR gate 18.

The fifth embodiment of the semiconductor integrated circuit device operates on the basis of the control signal and the substrate bias as follows:

1) When the control signal is in operation mode (=L) and further the substrate bias is shallower than the set value $S_1$, the substrate potential generating circuit 6 is activated, and the substrate charge injecting circuit 8 is deactivated, so that the substrate bias becomes deep.

2) When the control signal is in operation mode and further the substrate bias is deeper than the set value $S_1$, the substrate potential generating circuit 6 is deactivated, and the substrate charge injecting circuit 8 is activated, so that the substrate bias becomes shallow.

3) When the control signal is in standby mode (=H) and further the substrate bias is shallower than the set value $S_2$, the substrate potential generating circuit 6 is activated and the substrate charge injecting circuit 8 is deactivated, so that the substrate bias becomes deep.

4) When the control signal is in standby mode and further the substrate bias is deeper than the set value $S_2$, the substrate potential generating circuit 6 and the substrate charge injecting circuit 8 are both deactivated.

Figures 18, 19:
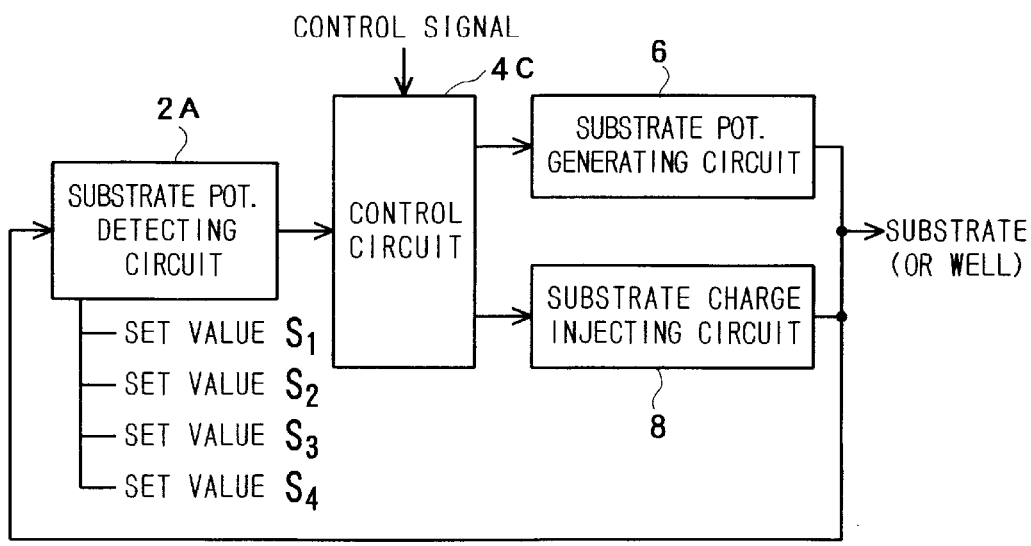
FIG. 18 is a table for assistance in explaining the operation of the fifth embodiment.
FIG. 19 is a block diagram showing a sixth embodiment of the present invention.

FIG. 18 shows a table which lists the above-mentioned operation results.

Therefore, in this fifth embodiment, the circuit device is so controlled that the substrate bias is set to the set value $S_1$ in operation mode and to the set value $S_3$ in standby mode. Therefore, it is possible to control the threshold value of the semiconductor integrated circuit device to a low value of less variation in operation mode and to switch the threshold value thereof to a high value in standby mode.

A sixth embodiment of the semiconductor integrated circuit device according to the present invention will be described hereinbelow with reference to FIG. 19. In this sixth embodiment, the substrate potential detecting circuit 2 and the control circuit 4 of the first embodiment shown in FIG. 1 are replaced with a substrate potential detecting circuit 2A and a control circuit 4C, respectively.

The substrate potential detecting circuit 2A shown in FIG. 19 is the same as with the case of the substrate potential detecting circuit 2A of the third embodiment shown in FIG. 10, in which the set value is increased by one, as compared with that of the first embodiment.

Figure 20:
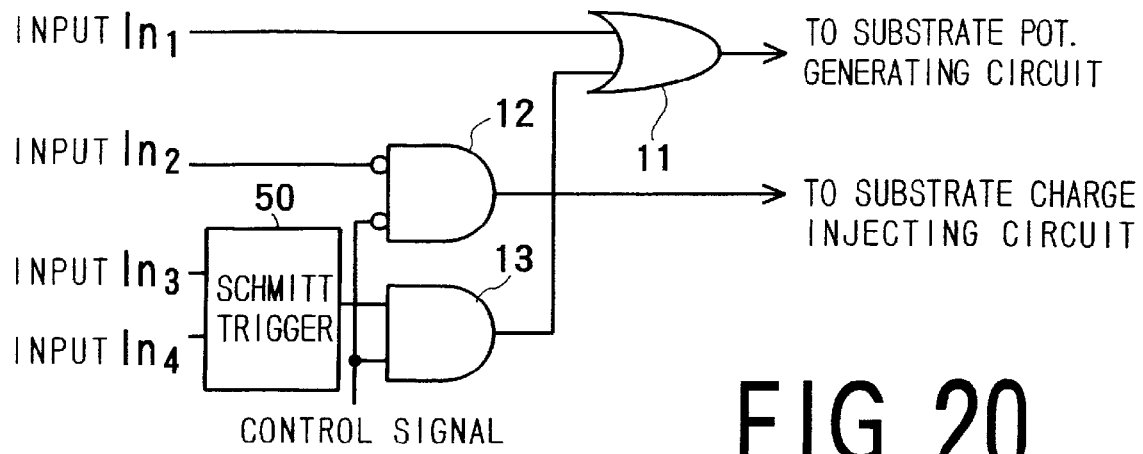
FIG. 20 is a block diagram showing the practical example of the control circuit related to the sixth embodiment.

On the other hand, the control circuit 4C drives the substrate potential generating circuit 6 and the substrate charge injecting circuit 8 on the basis of the first to fourth outputs applied by the substrate potential detecting circuit 2A. In this control circuit 4C shown in FIG. 20, a Schmitt trigger circuit 50 is additionally provided for the control circuit 4 of the first embodiment shown in FIG. 3. The Schmitt trigger circuit 50 is activated on the basis of the two inputs $In_3$ and $In_4$ which correspond to the third and fourth output signals of the substrate potential detecting circuit 2A, respectively. The operation signal thereof is applied to one input terminal of the AND gate 13.

As described above, when the set value $S_4$ of the substrate potential detecting circuit 2A is set to the vicinity of the set value $S_3$ and further when the Schmitt trigger circuit 50 is additionally provided in the control circuit, it is possible to eliminate the influence of noise generated when the substrate bias lies in the vicinity of the set values $S_3$ and $S_4$, as effectively as possible. Further, it is also possible to obtain the same effect as above, even if the set value $S_4$ of the substrate potential detecting circuit 2A is set to the vicinity of the set value $S_2$ or $S_1$. In the case where the set value $S_4$ is set to the vicinity of the set value $S_2$, the Schmitt trigger circuit 50 is activated on the basis of the output signal (which corresponds to the input $In_4$ in this embodiment) of the substrate potential detecting circuit having two different values in two regions before and after the newly added set value $S_4$ and the output of the substrate potential detecting circuit having two different values in two regions before and after the set value $S_2$. The output of the Schmitt trigger circuit 50 is applied to the input terminal of the gate to which the input $In_2$ is to be applied.

Figure 21:
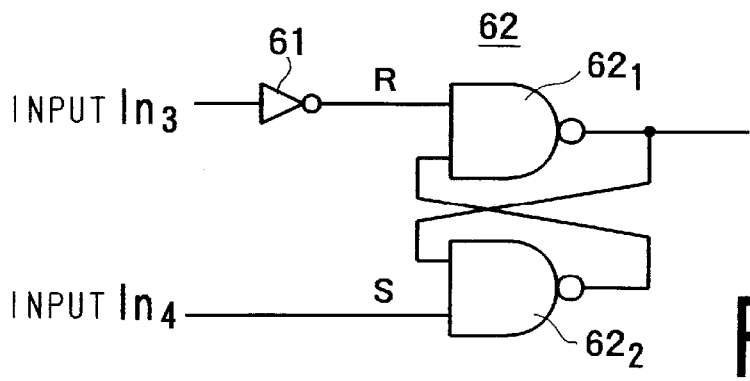
FIG. 21 is a circuit diagram showing a practical example of a Schmitt trigger circuit.
Figure 22:
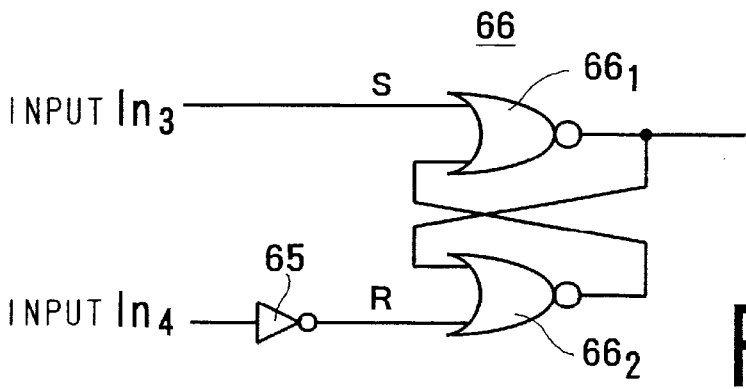
FIG. 22 is a circuit diagram showing another example of a Schmitt trigger circuit.

Further, as shown in FIG. 21, the Schmitt trigger circuit 50 can be constructed by an inversion gate 61, and an RS flip-flop circuit 62 composed of two cross-connected two-input NAND gates $62_1$ and $62_2$. In the same way, as shown in FIG. 22, the Schmitt trigger circuit 50 can be constructed by an inversion gate 65, and an RS flip-flop circuit 66 composed of two cross-connected two-input NAND gates $62_1$ and $62_2$.

Further, in the second to fifth embodiments of the semiconductor integrated circuit device according to the present invention, when the number of the set values of the substrate potential detecting circuit is increased by one and further the Schmitt trigger circuit is additionally provided for the control circuit, it is possible to eliminate the influence of noise as effectively as possible, in the same way as with the case of the sixth embodiment.

What is claimed is:

1. A semiconductor integrated circuit device, comprising:
    a detecting circuit for detecting a physical quantity value corresponding to substrate bias of a semiconductor substrate and for outputting n-units (n>2) of first to n-th output signals decided according to what region of physical quantity values the detected physical quantity value belongs, the region being decided separately on the basis of n-units of the first to nth set values,
    a control circuit for outputting drive signals on the basis of a control signal and the first to nth output signals of said detecting circuit;
    a substrate potential generating circuit activated on the basis of one of the drive signals of said control circuit, to allow the substrate bias to be deep by pumping out charges from the semiconductor substrate; and
    a substrate charge injecting circuit activated on the basis of the other of the drive signals of said control circuit, to allow the substrate bias to be shallow by injecting charges to the semiconductor substrate,
    wherein the control signal is a signal indicative of whether a circuit including MOSFETs formed on the semiconductor substrate is in operation mode or standby mode.

2. The semiconductor integrated circuit device of claim 1, wherein said substrate charge injecting circuit used for a P-type semiconductor substrate comprises:
    a P-channel MOSFET having a source terminal responsive to the drive signal applied by said control circuit, a gate connected to a ground supply voltage, and a substrate connected to a drive supply voltage; and
    an N-channel MOSFET formed on the P-type semiconductor substrate and having a source terminal connected to the P-type semiconductor substrate, a gate connected to the ground supply voltage, and a drain terminal connected to a drain of the P-channel MOSFET.

3. The semiconductor integrated circuit device of claim 1, wherein said substrate charge injecting circuit used for an N-type semiconductor substrate comprises:
    an N-channel MOSFET having a source terminal responsive to the drive signal applied by said control circuit, a gate connected to a supply voltage, and a substrate connected to a ground supply voltage; and
    a P-channel MOSFET formed on the N-type semiconductor substrate and having a source terminal connected to the N-type semiconductor substrate, a gate connected to the supply voltage, and a drain terminal connected to a drain of the N-channel MOSFET.

4. The semiconductor integrated circuit device of claim 1, wherein the number n of the set values is three or more; said control circuit comprises a Schmitt trigger circuit activated on the basis of one of two output signals of said detecting circuit having two different detected physical quantity values in regions before and after one of two adjacent set values of the n-units of set values and the other of the two output signals of said detecting circuit having two different detected physical quantity values in regions before and after the other of the two adjacent values thereof; and said control circuit generates drive signals on the basis of an output of the Schmitt trigger circuit and (n−2)-units of output signals obtained by subtracting the two output signals from the first to n-th output signals.

5. The semiconductor integrated circuit device of claim 1, wherein the number n of the set values is three; and said detecting circuit is a substrate potential detecting circuit for detecting potential of the semiconductor substrate, said control circuit operates as follows:
   1) when the control signal indicates operation mode and further when the substrate potential is shallower than the first set value as the substrate bias, said control circuit activates said substrate potential generating circuit and deactivates said substrate charge injecting circuit;
   2) when the control signal indicates the operation mode and further when the substrate potential is deeper than the first set value as the substrate bias but shallower than the second set value as the substrate bias, said control circuit deactivates both said substrate potential generating circuit and said substrate charge injecting circuit;
   3) when the control signal indicates the operation mode and further when the substrate potential is deeper than the second set value as the substrate bias, said control circuit deactivates said substrate potential generating circuit and activates said substrate charge injecting circuit;
   4) when the control signal indicates standby mode and further when the substrate potential is shallower than the third set value as the substrate bias, said control circuit activates said substrate potential generating circuit and deactivates said substrate charge injecting circuit; and
   5) when the control signal indicates the standby mode and further when the substrate potential is deeper than the third set value as the substrate bias, said control circuit deactivates both said substrate potential generating circuit and said substrate charge injecting circuit.

6. The semiconductor integrated circuit device of claim 5, wherein the substrate potential detecting circuit is a series circuit composed of a plurality of same-conductivity MOS transistors connected in series to each other, a substrate terminal of each MOS transistor being connected to a source terminal thereof and a gate terminal thereof being connected to a drain terminal thereof; and all MOS transistors are so selected as to have the same channel width with respect to each other and to be operative in a sub-threshold region thereof, respectively.

7. The semiconductor integrated circuit device of claim 6, wherein the substrate potential detecting circuit comprises an RS flip-flop circuit and an inversion gate, a set input terminal of the RS flip-flop circuit being connected to one of two different junction nodes of a transistor train of the series circuit and a reset input terminal of the RS flip-flop circuit being connected to the other of the two different junction nodes thereof via the inversion gate.

8. The semiconductor integrated circuit device of claim 7, wherein said substrate charge injecting circuit used for a P-type semiconductor substrate comprises:

a P-channel MOSFET having a source terminal responsive to the drive signal applied by said control circuit, a gate connected to a ground supply voltage, and a substrate connected to a drive supply voltage; and an N-channel MOSFET formed on the P-type semiconductor substrate and having a source terminal connected to the P-type semiconductor substrate, a gate connected to the ground supply voltage, and a drain terminal connected to a drain of the P-channel MOSFET.

9. The semiconductor integrated circuit device claim 7 wherein said substrate charge injecting circuit used for an N-type semiconductor substrate comprises:

an N-channel MOSFET having a source terminal responsive to the drive signal applied by said control circuit, a gate connected to a supply voltage, and a substrate connected to a ground supply voltage; and a P-channel MOSFET formed on the N-type semiconductor substrate and having a source terminal connected to the N-type semiconductor substrate, a gate connected to the supply voltage, and a drain terminal connected to a drain of the N-channel MOSFET.

10. The semiconductor integrated circuit device of claim 5, wherein the substrate potential detecting circuit is a first to n-th (n≧2) series circuits each composed of a plurality of same-conductivity MOS transistors connected in series to each other, a substrate terminal of each MOS transistor for constituting the i-th (i=1, ..., n) series circuit being connected to a source terminal thereof and a gate terminal thereof being connected to a drain terminal thereof; the i-th (i=1, ..., n) series circuit is connected between two different junction nodes of a transistor train of the (i−1)-th series circuit; and all MOS transistors for constituting the i-th (i=1, ..., n) series circuit are so selected as to have the same channel width with respect to each other and to be operative in a sub-threshold region thereof, respectively.

11. The semiconductor integrated circuit device of claim 10, wherein the substrate potential detecting circuit comprises an RS flip-flop circuit and an inversion gate, a set input terminal of the RS flip-flop circuit being connected to one of two different junction nodes of a transistor train of the n-th series circuit and a reset input terminal of the RS flip-flop circuit being connected to the other of the two different junction nodes thereof via the inversion gate.

12. The semiconductor integrated circuit device of claim 11, wherein the substrate charge injecting circuit used for a P-type semiconductor substrate comprises:

a P-channel MOSFET having a source terminal responsive to the drive signal applied by said control circuit, a gate connected to a ground supply voltage, and a substrate connected to a drive supply voltage; and an N-channel MOSFET formed on the P-type semiconductor substrate and having a source terminal connected to the P-type semiconductor substrate, a gate connected to the ground supply voltage, and a drain terminal connected to a drain of the P-channel MOSFET.

13. The semiconductor integrated circuit device of claim 11, wherein said substrate charge injecting circuit used for an N-type semiconductor substrate comprises:

an N-channel MOSFET having a source terminal responsive to the drive signal applied by said control circuit, a gate connected to a supply voltage, and a substrate connected to a ground supply voltage; and a P-channel MOSFET formed on the N-type semiconductor substrate and having a source, terminal connected to the N-type semiconductor substrate, a gate connected to the supply voltage, and a drain terminal connected to a drain of the N-channel MOSFET.

14. The semiconductor integrated circuit device of claim 1, wherein the number n of the set values is three; and said detecting circuit is a leak current detecting circuit for detecting leak current of MOSFETs formed on the semiconductor substrate, said control circuit operates as follows:

1) when the control signal indicates operation mode and further when the leak current is larger than the first set value, said control circuit activates said substrate potential generating circuit and deactivates said substrate charge injecting circuit;

2) when the control signal indicates the operation mode and further when the leak current is smaller than the first set value but larger than the second set value, said control circuit deactivates both said substrate potential generating circuit and said substrate charge injecting circuit;

3) when the control signal indicates the operation mode and further when the leak current is smaller than the second set value, said control circuit deactivates said substrate potential generating circuit and activates said substrate charge injecting circuit;

4) when the control signal indicates standby mode and further when the leak current is larger than the third set value, said control circuit activates said substrate potential generating circuit and deactivates said substrate charge injecting circuit; and 5) when the control signal indicates the standby mode and further when the leak current is smaller than the third set value, said control circuit deactivates both said substrate potential generating circuit and said substrate charge injecting circuit.

15. The semiconductor integrated circuit device of claim 14, wherein said substrate charge injecting circuit used for a P-type semiconductor substrate comprises:

a P-channel MOSFET having a source terminal responsive to the drive signal applied by said control circuit, a gate connected to a ground supply voltage, and a substrate connected to a drive supply voltage; and an N-channel MOSFET formed on the P-type semiconductor substrate and having a source terminal connected to the P-type semiconductor substrate, a gate connected to the ground supply voltage, and a drain terminal connected to a drain of the P-channel MOSFET.

16. The semiconductor integrated circuit device of claim 14, wherein said substrate charge injecting circuit used for an N-type semiconductor substrate comprises:

an N-channel MOSFET having a source terminal responsive to the drive signal applied by said control circuit, a gate connected to a supply voltage, and a substrate connected to a ground supply voltage; and a P-channel MOSFET formed on the N-type semiconductor substrate and having a source terminal connected to the N-type semiconductor substrate, a gate connected to the supply voltage, and a drain terminal connected to a drain of the N-channel MOSFET.

17. The semiconductor integrated circuit device of claim 1, wherein the number n of the set values is four; and said detecting circuit is a substrate potential detecting circuit for detecting potential of the semiconductor substrate, said control circuit operates as follows:

1) when the control signal indicates operation mode and further when the substrate potential is shallower than the first set value as the substrate bias, said control circuit activates said substrate potential generating circuit at high speed and deactivates said substrate charge injecting circuit;

2) when the control signal indicates the operation mode and further when the substrate potential is deeper than the first set value as the substrate bias but shallower than the second set value as the substrate bias, said control circuit activates said substrate potential generating circuit at low speed and deactivates said substrate charge injecting circuit;

3) when the control signal indicates the operation mode and further when the substrate potential is deeper than the second set value as the substrate bias but shallower than the third set value as the substrate bias, said control circuit deactivates both said substrate potential generating circuit and said substrate charge injecting circuit;

4) when the control signal indicates the operation mode and further when the substrate potential is deeper than the third set value as the substrate bias, said control circuit deactivates said substrate potential generating circuit and activates said substrate charge injecting circuit;

5) when the control signal indicates standby mode and further when the substrate potential is shallower than the fourth set value as the substrate bias, said control circuit activates said substrate potential generating circuit and deactivates said substrate charge injecting circuit; and 6) when the control signal indicates the standby mode and further when the substrate potential is deeper than the fourth set value as the substrate bias, said control circuit deactivates both said substrate potential generating circuit and said substrate charge injecting circuit.

18. The semiconductor integrated circuit device of claim 17, wherein said control circuit outputs a first drive signal and a second drive signal to the substrate potential generating circuit; and the substrate potential generating circuit comprises:

a first oscillator circuit for generating a high speed pulse voltage on the basis of the first drive signal;

a second oscillator circuit for generating a low speed pulse voltage on the basis of the second drive signal; and a pump circuit activated on the basis of any one of the pulse voltages applied by said first and second oscillator circuits, to pump out charges from the semiconductor substrate.

19. The semiconductor integrated circuit device of claim 17, wherein the substrate potential detecting circuit is a series circuit composed of a plurality of same-conductivity MOS transistors connected in series to each other, a substrate terminal of each MOS transistor being connected to a source terminal thereof and a gate terminal thereof being connected to a drain terminal thereof; and all MOS transistors are so selected as to have the same channel width with respect to each other and to be operative in a sub-threshold region thereof, respectively.

20. The semiconductor integrated circuit device of claim 19, wherein the substrate potential detecting circuit comprises an RS flip-flop circuit and an inversion gate, a set input terminal of the RS flip-flop circuit being connected to one of two different junction nodes of a transistor train of the series circuit and a reset input terminal of the RS flip-flop circuit being connected to the other of the two different junction nodes thereof via the inversion gate.

21. The semiconductor integrated circuit device of claim 20, wherein said substrate charge injecting circuit used for a P-type semiconductor substrate comprises:

a P-channel MOSFET having a source terminal responsive to the drive signal applied by said control circuit, a gate connected to a ground supply voltage, and a substrate connected to a drive supply voltage; and an N-channel MOSFET formed on the P-type semiconductor substrate and having a source terminal connected to the P-type semiconductor substrate, a gate connected to the ground supply voltage, and a drain terminal connected to a drain of the P-channel MOSFET.

22. The semiconductor integrated circuit device of claim 20, wherein said substrate charge injecting circuit used for an N-type semiconductor substrate comprises:

an N-channel MOSFET having a source terminal responsive to the drive signal applied by said control circuit, a gate connected to a supply voltage, and a substrate connected to a ground supply voltage; and a P-channel MOSFET formed on the N-type semiconductor substrate and having a source terminal connected to the N-type semiconductor substrate, a gate connected to the supply voltage, and a drain terminal connected to a drain of the N-channel MOSFET.

23. The semiconductor integrated circuit device of claim 17, wherein the substrate potential detecting circuit is a first to n-th (n>2) series circuits each composed of a plurality of same-conductivity MOS transistors connected in series to each other, a substrate terminal of each MOS transistor for constituting the i-th (i=1, ..., n) series circuit being connected to a source terminal thereof and a gate terminal thereof being connected to a drain terminal thereof; the i-th (i=1, ..., n) series circuit is connected between two different junction nodes of a transistor train of the (i−1)-th series circuit; and all MOS transistors for constituting the i-th (i=1, ..., n) series circuit are so selected as to have the same channel width with respect to each other and to be operative in a sub-threshold region thereof, respectively.

24. The semiconductor integrated circuit device of claim 23, wherein the substrate potential detecting circuit comprises an RS flip-flop circuit and an inversion gate, a set input terminal of the RS flip-flop circuit being connected to one of two different junction nodes of a transistor train of the n-th series circuit and a reset input terminal of the RS flip-flop circuit being connected to the other of the two different junction nodes thereof via the inversion gate.

25. The semiconductor integrated circuit device of claim 24, wherein said substrate charge injecting circuit used for a P-type semiconductor substrate comprises:

a P-channel MOSFET having a source terminal responsive to the drive signal applied by said control circuit, a gate connected to a ground supply voltage, and a substrate connected to a drive supply voltage; and an N-channel MOSFET formed on the P-type semiconductor substrate and having a source terminal connected to the P-type semiconductor substrate, a gate connected to the ground supply voltage, and a drain terminal connected to a drain of the P-channel MOSFET.

26. The semiconductor integrated circuit device of claim 24, wherein said substrate charge injecting circuit used for an N-type semiconductor substrate comprises:

an N-channel MOSFET having a source terminal responsive to the drive signal applied by said control circuit, a gate connected to a supply voltage, and a substrate connected to a ground supply voltage; and a P-channel MOSFET formed on the N-type semiconductor substrate and having a source terminal connected to the N-type semiconductor substrate, a gate connected to the supply voltage, and a drain terminal connected to a drain of the N-channel MOSFET.

27. The semiconductor integrated circuit device of claim 1, wherein the number n of the set values is four; and said detecting circuit is a leak current detecting circuit for detecting leak current of MOSFETs formed on the semiconductor substrate, said control circuit operates as follows:

1) when the control signal indicates operation mode and further when the leak current is larger than the first set value, said control circuit activates said substrate potential generating circuit at high speed and deactivates said substrate charge injecting circuit;

2) when the control signal indicates the operation mode and further when the leak current is smaller than the first set value but larger than the second set value, said control circuit activates said substrate potential generating circuit at low speed and deactivates said substrate charge injecting circuit;

3) when the control signal indicates the operation mode and further when the leak current is smaller than the second set value but larger than the third set value, said control circuit deactivates both said substrate potential generating circuit and said substrate charge injecting circuit;

4) when the control signal indicates the operation mode and further when the leak current is smaller than the third set value, said control circuit deactivates said substrate potential generating circuit and activates said substrate charge injecting circuit;

5) when the control signal indicates standby mode and further when the leak current is larger than the fourth set value, said control circuit activates said substrate potential generating circuit and deactivates said substrate charge injecting circuit; and 6) when the control signal indicates the standby mode and further when the leak current is smaller than the fourth set value, said control circuit deactivates both said substrate potential generating circuit and said substrate charge injecting circuit.

28. The semiconductor integrated circuit device of claim 27, wherein said control circuit outputs a first drive signal and a second drive signal to the substrate potential generating circuit; and the substrate potential generating circuit comprises:

a first oscillator circuit for generating a high speed pulse voltage on the basis of the first drive signal;

a second oscillator circuit for generating a low speed pulse voltage on the basis of the second drive signal; and a pump circuit activated on the basis of any one of the pulse voltages applied by said first and second oscillator circuits, to pump out charges from the semiconductor substrate.

29. The semiconductor integrated circuit device of claim 28, wherein said substrate charge injecting circuit used for a P-type semiconductor substrate comprises:

a P-channel MOSFET having a source terminal responsive to the drive signal applied by said control circuit, a gate connected to a ground supply voltage, and a substrate connected to a drive supply voltage; and an N-channel MOSFET formed on the P-type semiconductor substrate and having a source terminal connected to the P-type semiconductor substrate, a gate connected to the ground supply voltage, and a drain terminal connected to a drain of the P-channel MOSFET.

30. The semiconductor integrated circuit device of claim 28, wherein said substrate charge injecting circuit used for an N-type semiconductor substrate comprises:

an N-channel MOSFET having a source terminal responsive to the drive signal applied by said control circuit, a gate connected to a supply voltage, and a substrate connected to a ground supply voltage; and a P-channel MOSFET formed on the N-type semiconductor substrate and having a source terminal connected to the N-type semiconductor substrate, a gate connected to the supply voltage, and a drain terminal connected to a drain of the N-channel MOSFET.

31. The semiconductor integrated circuit device of claim 1, wherein the number n of the set values is two; and said detecting circuit is a substrate potential detecting circuit for detecting potential of the semiconductor substrate, said control circuit operates as follows:

1) when the control signal indicates operation mode and further when the substrate potential is shallower than the first set value as the substrate bias, said control circuit activates said substrate potential generating circuit and deactivates said substrate charge injecting circuit;

2) when the control signal indicates the operation mode and further when the substrate potential is deeper than the first set value as the substrate bias, said control circuit deactivates said substrate potential generating circuit and activates said substrate charge injecting circuit;

3) when the control signal indicates standby mode and further when the substrate potential is shallower than the second set value as the substrate bias, said control circuit activates said substrate potential generating circuit and deactivates said substrate charge injecting circuit; and 4) when the control signal indicates the standby mode and further when the substrate potential is deeper than the second set value as the substrate bias, said control circuit deactivates both said substrate potential generating circuit and said substrate charge injecting circuit.

32. The semiconductor integrated circuit device of claim 31, wherein the substrate potential detecting circuit is a series circuit composed of a plurality of same-conductivity MOS transistors connected in series to each other, a substrate terminal of each MOS transistor being connected to a source terminal thereof and a gate terminal thereof being connected to a drain terminal thereof; and all MOS transistors are so selected as to have the same channel width with respect to each other and to be operative in a sub-threshold region thereof, respectively.

33. The semiconductor integrated circuit device of claim 32, wherein the substrate potential detecting circuit comprises an RS flip-flop circuit and an inversion gate, a set input terminal of the RS flip-flop circuit being connected to one of two different junction nodes of a transistor train of the series circuit and a reset input terminal of the RS flip-flop circuit being connected to the other of the two different junction nodes thereof via the inversion gate.

34. The semiconductor integrated circuit device of claim 33, wherein said substrate charge injecting circuit used for a P-type semiconductor substrate comprises:

a P-channel MOSFET having a source terminal responsive to the drive signal applied by said control circuit, a gate connected to a ground supply voltage, and a substrate connected to a drive supply voltage; and an N-channel MOSFET formed on the P-type semiconductor substrate and having a source terminal connected to the P-type semiconductor substrate, a gate connected to the ground supply voltage, and a drain terminal connected to a drain of the P-channel MOSFET.

35. The semiconductor integrated circuit device of claim 33, wherein said substrate charge injecting circuit used for an N-type semiconductor substrate comprises:

an N-channel MOSFET having a source terminal responsive to the drive signal applied by said control circuit, a gate connected to a supply voltage, and a substrate connected to a ground supply voltage; and a P-channel MOSFET formed on the N-type semiconductor substrate and having a source terminal connected to the N-type semiconductor substrate, a gate connected to the supply voltage, and a drain terminal connected to a drain of the N-channel MOSFET.

36. The semiconductor integrated circuit device of claim 31, wherein the substrate potential detecting circuit is a first to n-th (n≦2) series circuits each composed of a plurality of same-conductivity MOS transistors connected in series to each other, a substrate terminal of each MOS transistor for constituting the i-th (i=1, . . . , n) series circuit being connected to a source terminal thereof and a gate terminal thereof being connected to a drain terminal thereof; the i-th (i=1, . . . , n) series circuit is connected between two different junction nodes of a transistor train of the (i−1)-th series circuit; and all MOS transistors for constituting the i-th (i=1, . . . , n) series circuit are so selected as to have the same channel width with respect to each other and to be operative in a sub-threshold region thereof, respectively.

37. The semiconductor integrated circuit device of claim 36, wherein the substrate potential detecting circuit comprises an RS flip-flop circuit and an inversion gate, a set input terminal of the RS flip-flop circuit being connected to one of two different junction nodes of a transistor train of the n-th series circuit and a reset input terminal of the RS flip-flop circuit being connected to the other of the two different junction nodes thereof via the inversion gate.

38. The semiconductor integrated circuit device of claim 37, wherein said substrate charge injecting circuit used for a P-type semiconductor substrate comprises:

a P-channel MOSFET having a source terminal responsive to the drive signal applied by said control circuit, a gate connected to a ground supply voltage, and a substrate connected to a drive supply voltage; and an N-channel MOSFET formed on the P-type semiconductor substrate and having a source terminal connected to the P-type semiconductor substrate, a gate connected to the ground supply voltage, and a drain terminal connected to a drain of the P-channel MOSFET.

39. The semiconductor integrated circuit device of claim 37, wherein said substrate charge injecting circuit used for an N-type semiconductor substrate comprises:

an N-channel MOSFET having a source terminal responsive to the drive signal applied by said control circuit, a gate connected to a supply voltage, and a substrate connected to a ground supply voltage; and a P-channel MOSFET formed on the N-type semiconductor substrate and having a source terminal connected to the N-type semiconductor substrate, a gate connected to the supply voltage, and a drain terminal connected to a drain of the N-channel MOSFET.

40. The semiconductor integrated circuit device of claim 1, wherein the number n of the set values is two; and said detecting circuit is a leak current detecting circuit for detecting leak current of MOSFETs formed on the semiconductor substrate, said control circuit operates as follows:

1) when the control signal indicates operation mode and further when the leak current is larger than the first set value, said control circuit activates said substrate potential generating circuit and deactivates said substrate charge injecting circuit;

2) when the control signal indicates the operation mode and further when the leak current is smaller than the first set value, said control circuit deactivates said substrate potential generating circuit and activates said substrate charge injecting circuit;

3) when the control signal indicates standby mode and further when the leak current is larger than the second set value, said control circuit activates said substrate potential generating circuit and, deactivates said substrate charge injecting circuit; and 4) when the control signal indicates the standby mode and further when the leak current is smaller than the second set value, said control circuit deactivates both said substrate potential generating circuit and said substrate charge injecting circuit.

41. The semiconductor integrated circuit device of claim 40, wherein said substrate charge injecting circuit used for a P-type semiconductor substrate comprises:

a P-channel MOSFET having a source terminal responsive to the drive signal applied by said control circuit, a gate connected to a ground supply voltage, and a substrate connected to a drive supply voltage; and an N-channel MOSFET formed on the P-type semiconductor substrate and having a source terminal connected to the P-type semiconductor substrate, a gate connected to the ground supply voltage, and a drain terminal connected to a drain of the P-channel MOSFET.

42. The semiconductor integrated circuit device of claim 40, wherein said substrate charge injecting circuit used for an N-type semiconductor substrate comprises an N-channel MOSFET having a source terminal responsive to the drive signal applied by said control circuit, a gate connected to a supply voltage, and a substrate connected to a ground supply voltage; and a P-channel MOSFET formed on the N-type semiconductor substrate and having a source terminal connected to the N-type semiconductor substrate, a gate connected to the supply voltage, and a drain terminal connected to a drain of the N-channel MOSFET.

* * * * *